United States Patent
Koos et al.

(10) Patent No.: US 11,630,394 B2
(45) Date of Patent: Apr. 18, 2023

(54) METHOD AND DEVICE FOR LITHOGRAPHICALLY PRODUCING A TARGET STRUCTURE ON A NON-PLANAR INITIAL STRUCTURE

(71) Applicant: Karlsruhe Institute of Technology, Karlsruhe (DE)

(72) Inventors: Christian Koos, Siegelsbach (DE); Tobias Hoose, Karlsruhe (DE); Philipp Dietrich, Stuttgart (DE); Matthias Blaicher, Ettlingen (DE); Maria Laura Gödecke, Stuttgart (DE); Nicole Lindenmann, Niefern-Öschelbronn (DE)

(73) Assignee: Karlsruhe Institute of Technology, Karlsruhe (DE)

( * ) Notice: Subject to any disclaimer, the term of this patent is extended or adjusted under 35 U.S.C. 154(b) by 0 days.

(21) Appl. No.: 17/471,740

(22) Filed: Sep. 10, 2021

(65) Prior Publication Data
US 2021/0405537 A1    Dec. 30, 2021

Related U.S. Application Data

(60) Division of application No. 16/263,461, filed on Jan. 31, 2019, now Pat. No. 11,143,966, which is a continuation of application No. PCT/EP2017/069764, filed on Aug. 4, 2017.

(30) Foreign Application Priority Data

Aug. 5, 2016  (DE) ..................... 10 2016 214 606.8

(51) Int. Cl.
  *G03F 7/20*   (2006.01)
  *G03F 7/00*   (2006.01)
(52) U.S. Cl.
  CPC ............ *G03F 7/703* (2013.01); *G03F 7/0005* (2013.01); *G03F 7/0037* (2013.01)
(58) Field of Classification Search
  CPC ....... G03F 7/0005; G03F 7/0037; G03F 7/703
  USPC .......................................................... 430/30
  See application file for complete search history.

(56) References Cited

U.S. PATENT DOCUMENTS

| 6,346,979 B1 | 2/2002 | Ausschnitt et al. |
| 8,846,160 B2 | 9/2014 | Wu et al. |
| 8,903,205 B2 | 12/2014 | Koos et al. |
| 9,034,222 B2 | 5/2015 | Koos et al. |
| 2007/0175860 A1 | 8/2007 | Liu |
| 2010/0003619 A1 | 1/2010 | Das et al. |
| 2013/0315530 A1 | 11/2013 | La Porta et al. |

FOREIGN PATENT DOCUMENTS

| DE | 10 2008 054 582 A1 | 7/2009 |
| DE | 10 2012 010 635 A1 | 11/2013 |
| EP | 2 067 610 B1 | 11/2011 |
| JP | H9-243869 A | 9/1997 |
| JP | H10-209000 A | 8/1998 |
| WO | WO 01796959 A2 | 12/2001 |
| WO | WO 2006/138587 A2 | 12/2006 |
| WO | WO 2009/009208 A2 | 1/2009 |
| WO | WO 2009/134762 A2 | 11/2009 |

OTHER PUBLICATIONS

International Search Report and English Translation of the Written Opinion of the International Searching Authority, PCT/EP2017/069764, dated Oct. 27, 2017, 8 pages.
Radtke et al., Laser Lithographic Fabrication and Characterization of a Spherical Artificial Compound Eye, Optics Express, Mar. 19, 2007, pp. 3067-3077.
Radtke et al., Laser Lithography on Non-Planar Surfaces, Optics Express, Feb. 5, 2007, pp. 1167-1174.
Nishiyama et al., SiO2-based Nonplanar Structures Fabricated Using Femtosecond Laser Lithography, Optics Express, Oct. 27, 2008, pp. 17288-17294.
Salter et al., Focussing Over the Edge: Adaptive Subsurface Laser Fabrication up to the Sample Face, Optics Express, Aug. 27, 2012, pp. 19978-19989.
English Translation of the International Preliminary Report on Patentability, PCT/EP2017/069764, dated Feb. 5, 2017, 6 pages.

*Primary Examiner* — Christopher G Young
(74) *Attorney, Agent, or Firm* — Bose McKinney & Evans LLP

(57) ABSTRACT

Disclosed is a method for lithographically producing a target structure on a non-planar initial structure by exposing a photoresist by means of a lithography beam. In the inventive method, the topography of a surface of the non-planar initial structure is detected. A test parameter for the lithography beam is used and an interaction of the lithography beam with the initial structure and the resultant change in the lithography beam and/or the target structure to be produced are determined. A correction parameter for the lithography beam is determined such that the change in the lithography beam and/or the target structure to be produced that is caused by the interaction of the lithography beam with the initial structure is reduced. The desired target structure on the initial structure is produced by exposing the photoresist by means of the lithography beam using the correction parameter.

20 Claims, 31 Drawing Sheets

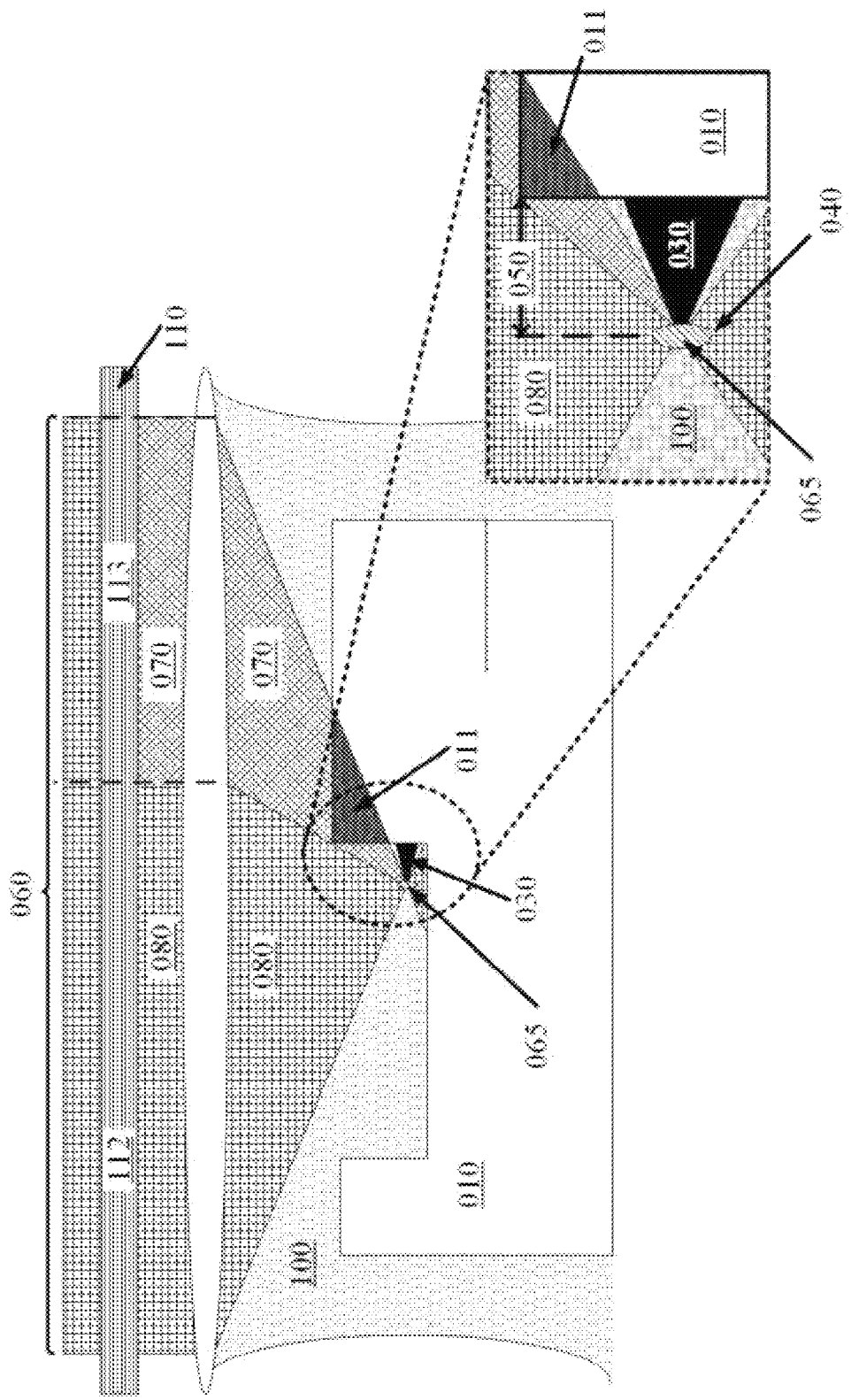

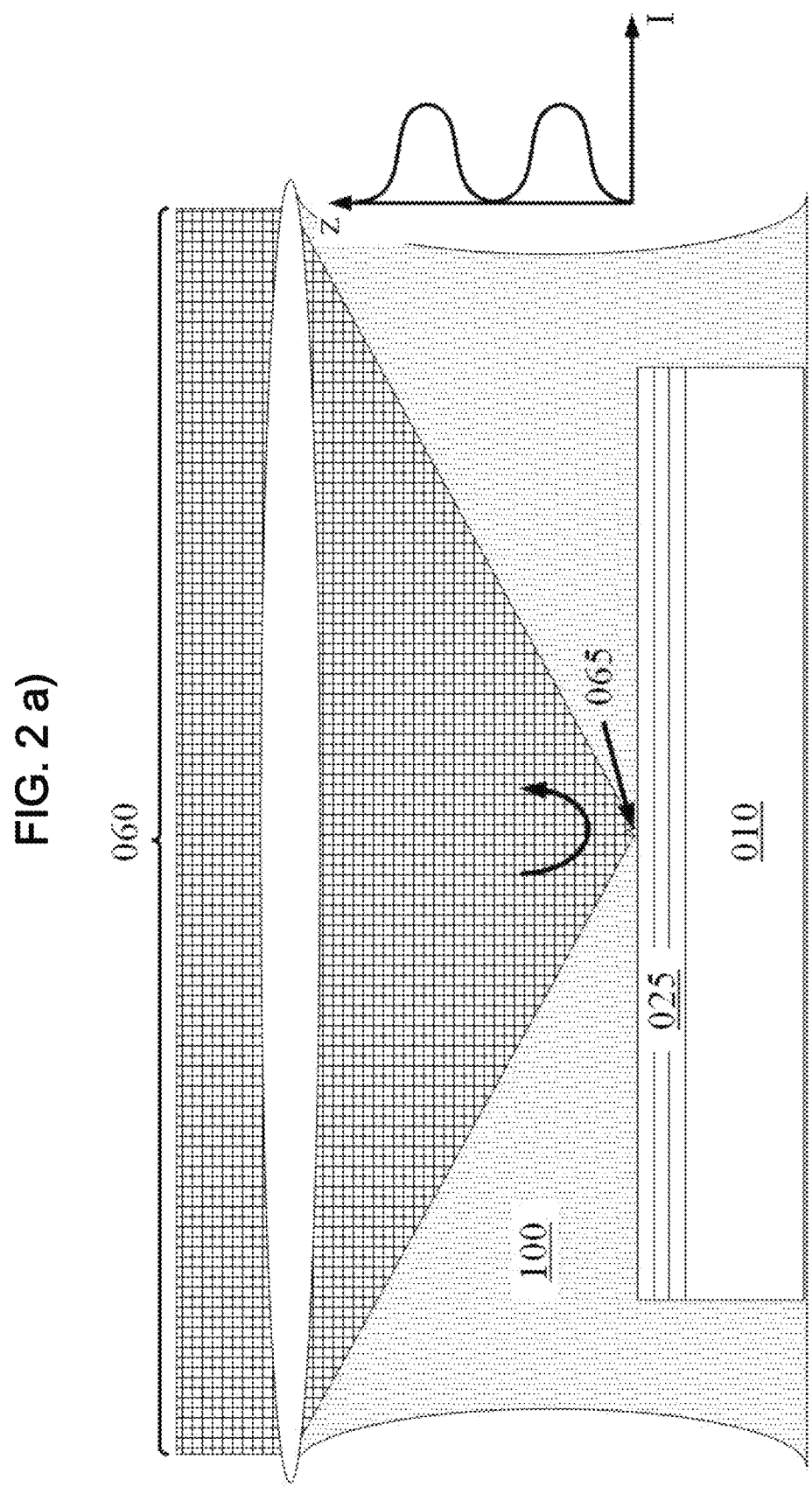

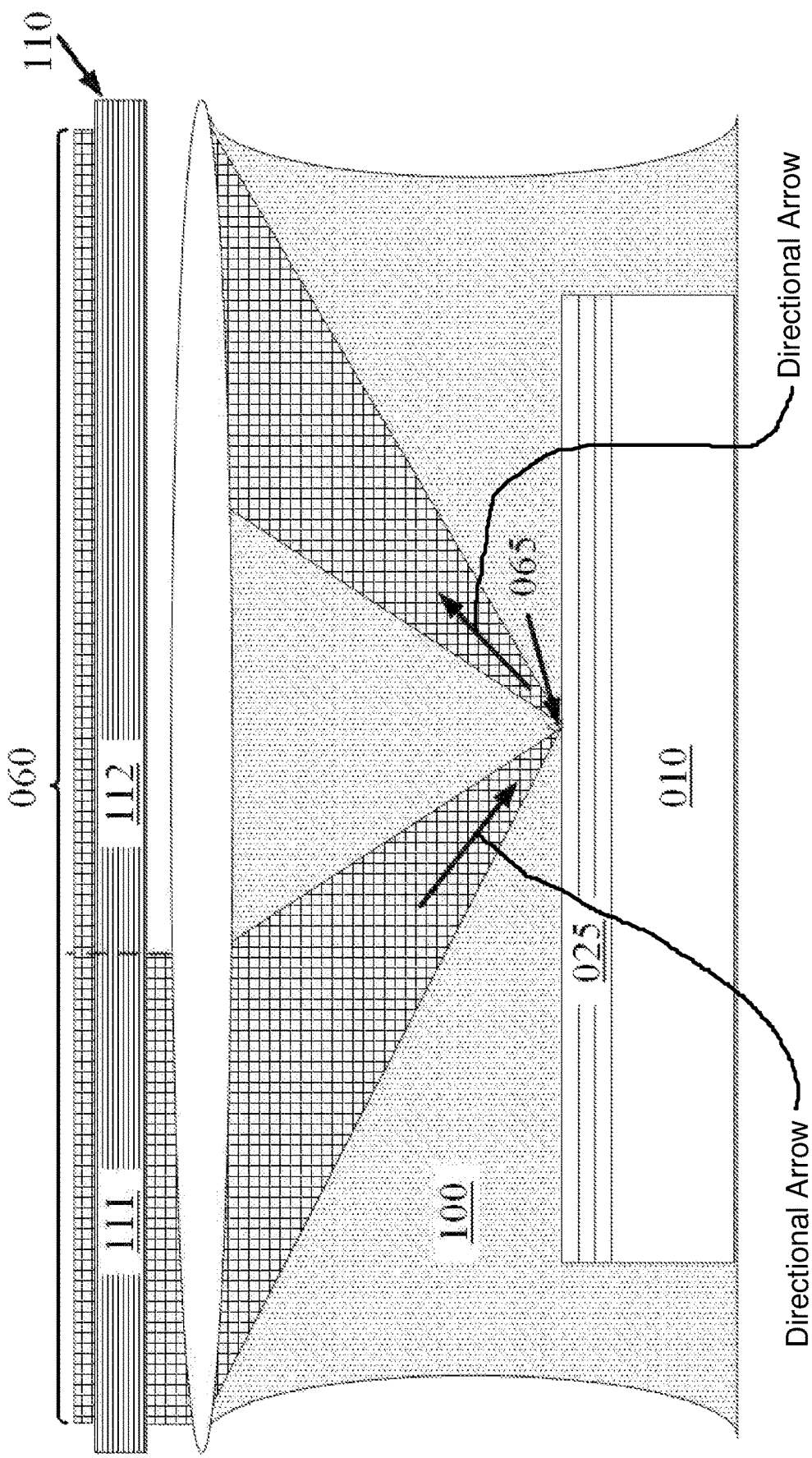

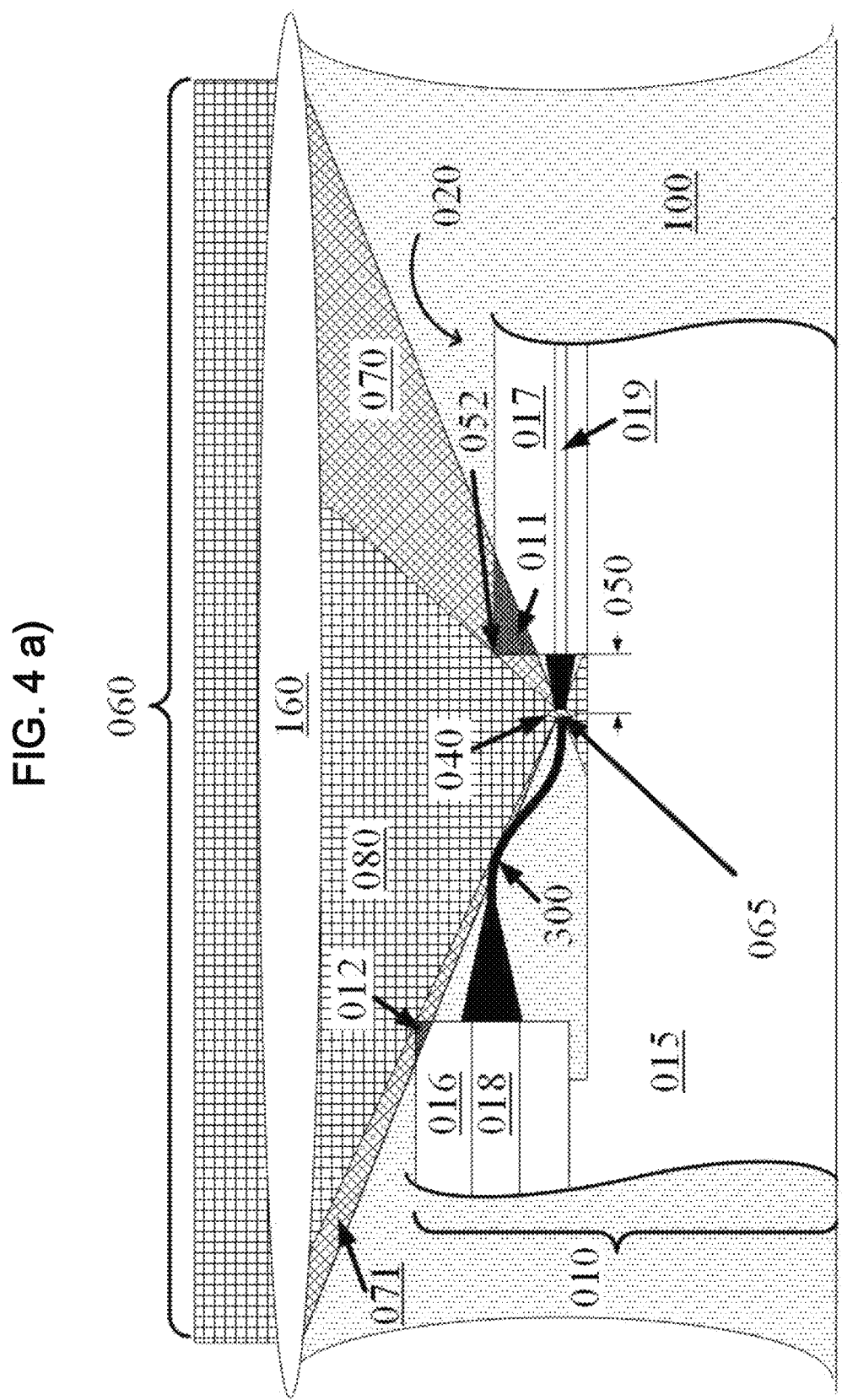

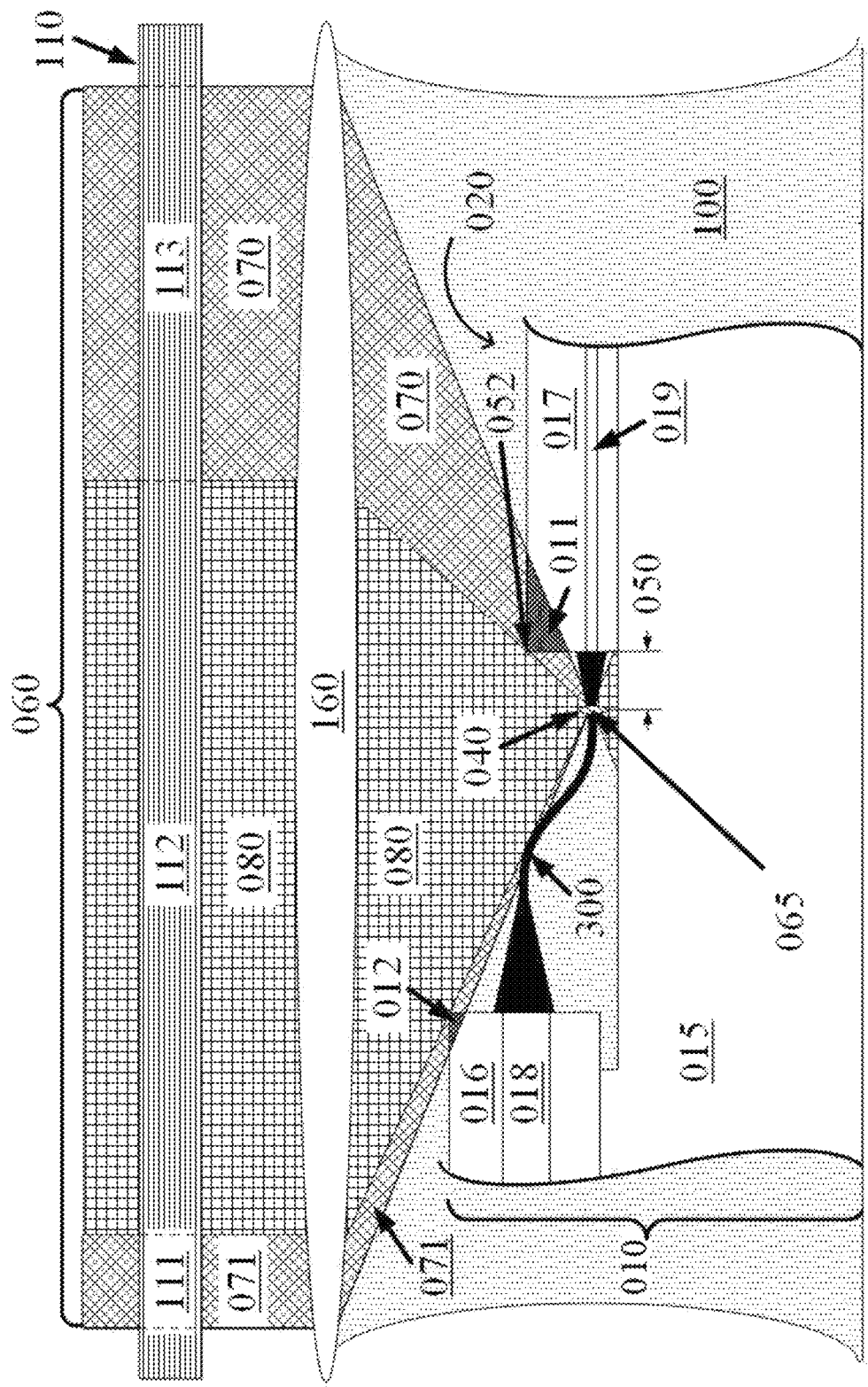

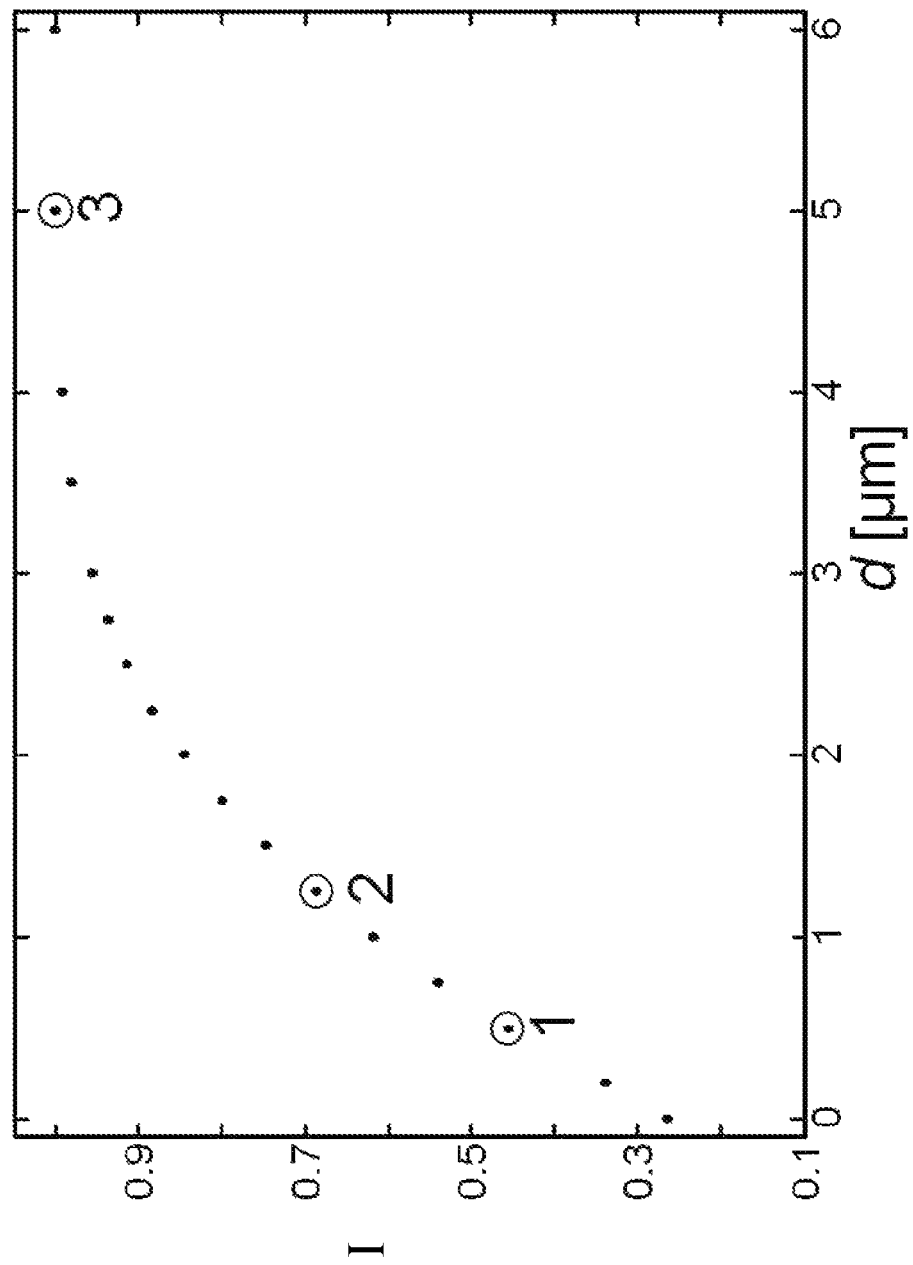

FIG. 5 c)
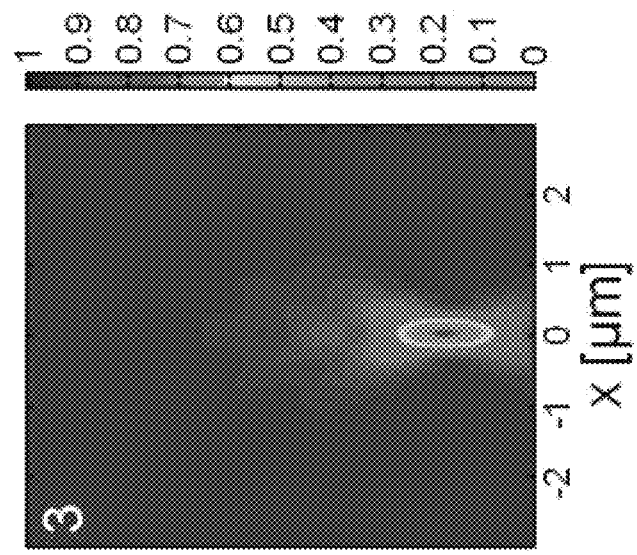
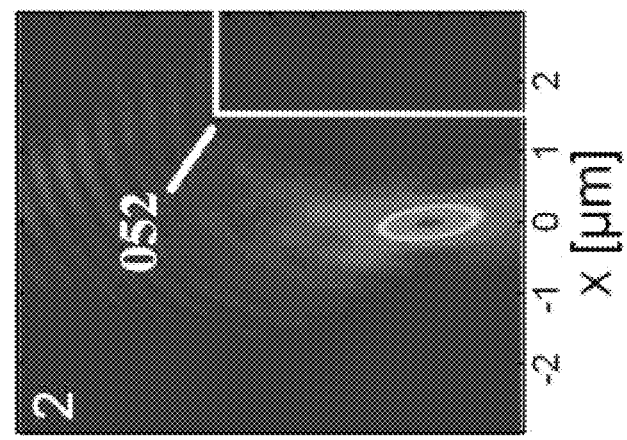
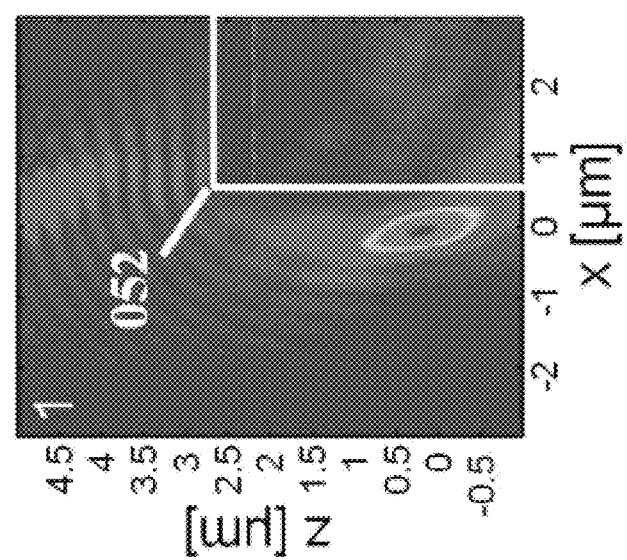

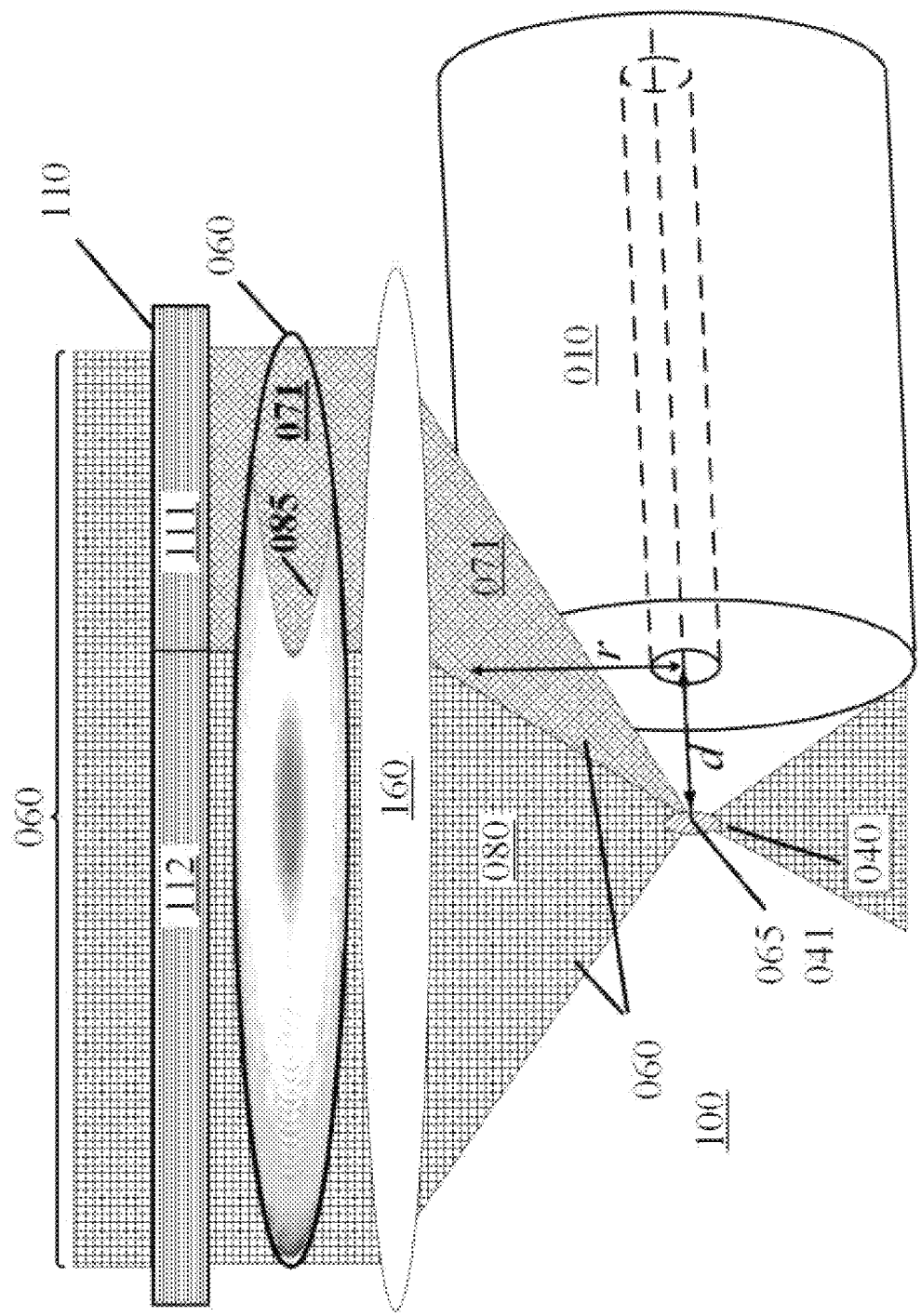

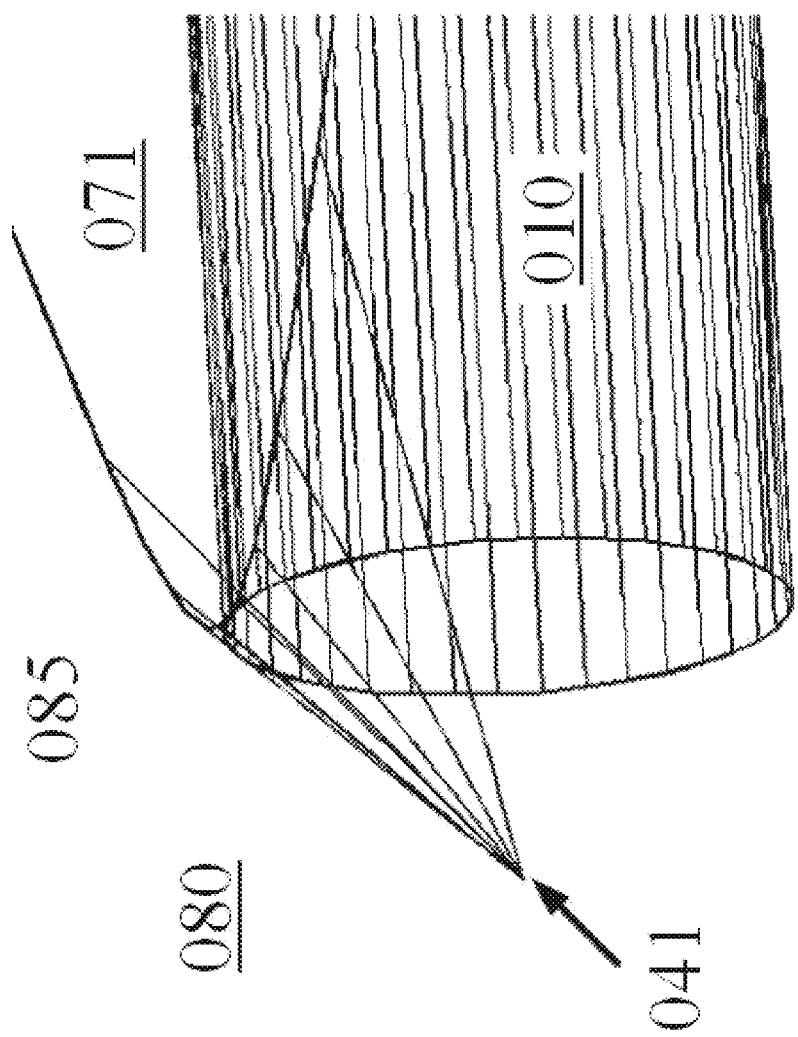

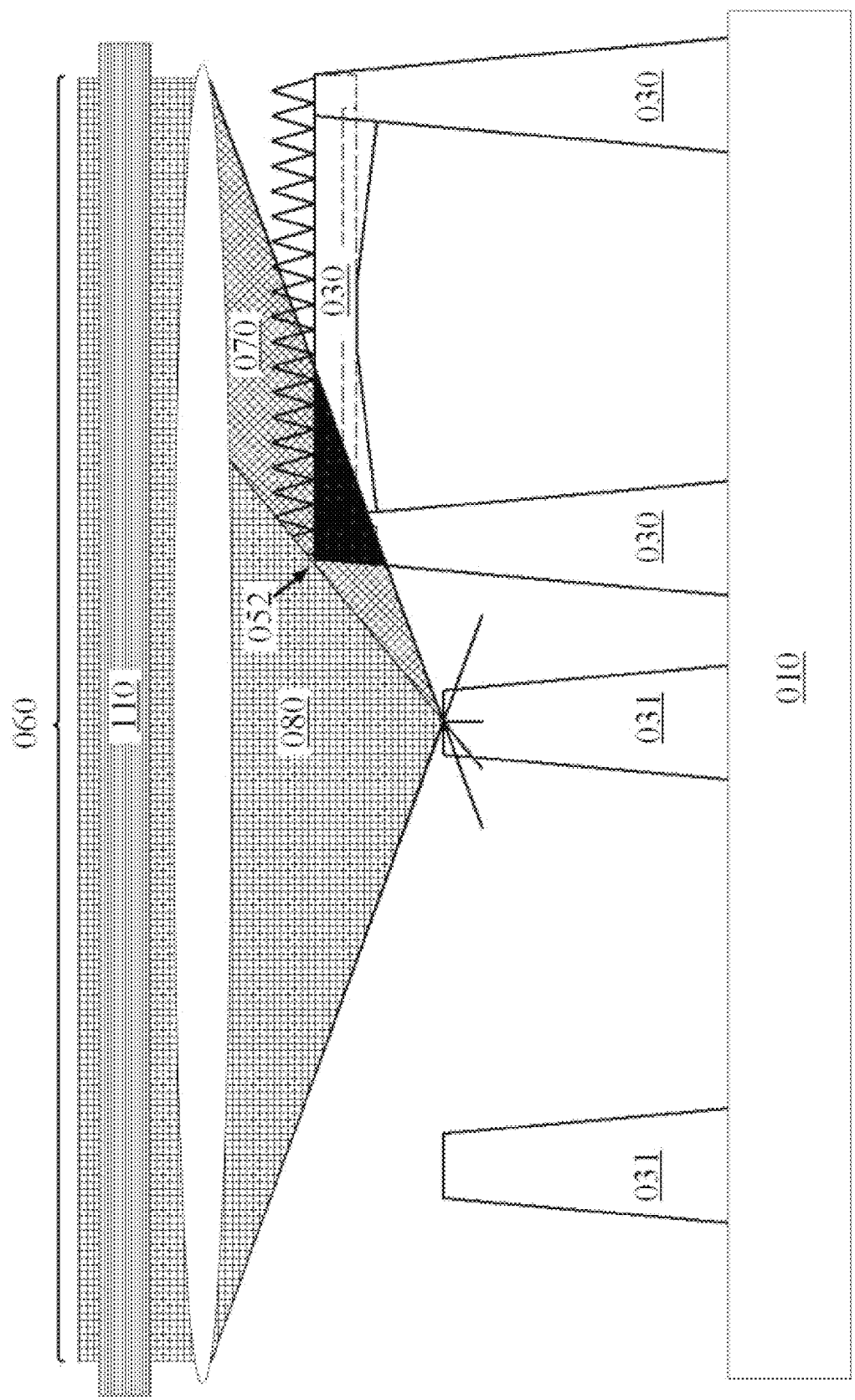

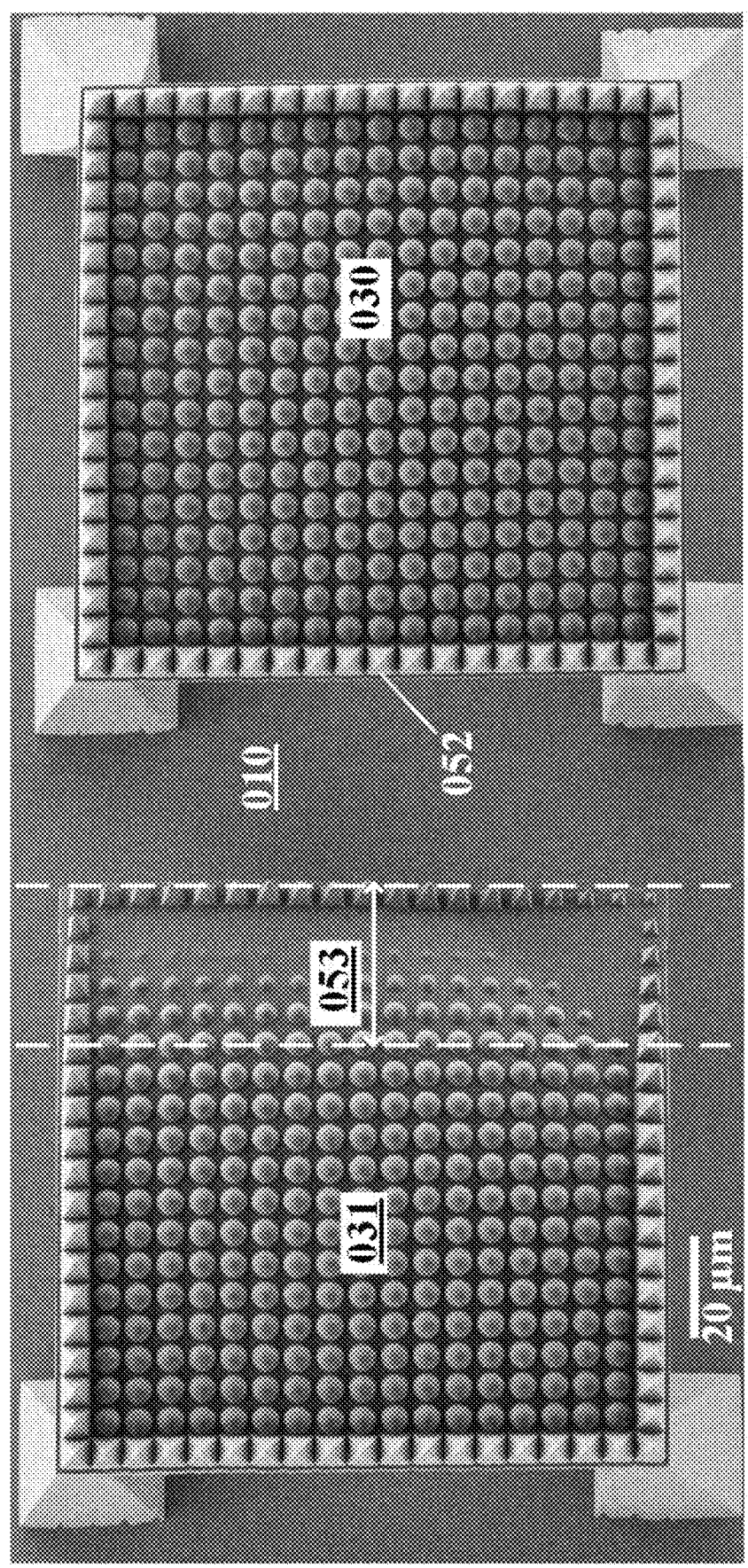

METHOD AND DEVICE FOR LITHOGRAPHICALLY PRODUCING A TARGET STRUCTURE ON A NON-PLANAR INITIAL STRUCTURE

RELATED APPLICATIONS

This application is a divisional of U.S. application Ser. No. 16/263,461 filed on Jan. 31, 2019 which is a continuation of PCT/EP2017/069764, filed on Aug. 4, 2017, which claims priority to DE 10 2016 214 606.8, filed on Aug. 5, 2016, the entire disclosures of all of which are hereby incorporated herein by reference.

BACKGROUND

This disclosure lies in the field of direct writing optical lithography and relates to a method and a device for lithographically producing a target structure on a non-planar initial structure. In this case, the non-planar initial structure is understood to mean a three-dimensional structure having a surface which has a topography which is extended in all three dimensions of space and which serves as a carrier for an additional target structure producible by direct writing optical lithography. The initial structure can be in particular a non-planar structured surface or, alternatively or additionally, an arrangement of discrete micro-engineering or micro-optical components. Furthermore, structures produced during the present method can likewise be part of the initial structure for further target structures and in particular can reshape a previously planar structure into a non-planar initial structure.

The prior art discloses devices and methods for lithographically producing a target structure on a non-planar initial structure. In this case, generally an effect is observable that a light beam used for the lithography, which is referred to hereinafter as "lithography beam," interacts with the initial structure. Firstly, this can lead to an influencing of the lithography beam and thus to a change in the target structure by virtue of the fact that transparent partial regions of the initial structure can contribute to a change in a wavefront of the lithography beam and thus to a deformation of a beam profile of the lithography beam or by virtue of the fact that non-transparent partial regions of the initial structure can lead to a shading of parts of the lithography beam. The effects described can occur primarily if the lithography beam has a high numerical aperture. Secondly, the interaction of the lithography beam with the non-planar initial structure can also lead to an optically induced local change in the initial structure. In a similar manner to the initial structure, partial regions of the target structure already produced can also themselves interact with the lithography beam and correspondingly influence the latter, in particular if a partial region of the target structure adjoins a partial region already produced.

The effects described can be observed in particular in three-dimensionally high-resolution patterning methods, in particular single-photon UV lithography, or from methods which make use of multi-photon effects, such as, e.g., two-photon lithography. These patterning methods use lithography beams having intensity maxima which are narrowly delimited at the focal point in axial and lateral directions and which for producing ellipsoidal three-dimensional volume elements, which are also referred to as "voxels" and which have the smallest possible aspect ratios of long to short semiaxis. For this purpose, use is made of exposure optical units having a high numerical aperture on the output side, such that a cone described by the convergent lithography beam substantially fills a complete volume between the exposure optical unit and the focal point, whereby the lithography beam can interact with all partial regions of the initial structure that are situated in said volume. At the same time, shape, size and position of the volume element produced by multi-photon polymerization are sensitive with regard to a change in an intensity distribution at the focal point of the lithography beam and thus also with regard to changes in the beam profile which are produced as a result of interactions with the initial structure. In addition, multi-photon methods require a high optical power, which generally are achieved only using pulsed lasers as light sources. Partial regions of the initial structure which are subjected to the lithography beam can furthermore be influenced as a result. This can also apply to lithography in the ultraviolet radiation range, for which continuously emitting lasers can also be used, the beams of which can likewise interact with the initial structure.

EP 2 067 610 B1 discloses a method for producing three-dimensional structures by a layered construction, wherein a planar surface of a light-curing resin is illuminated and structures that have already been exposed are moved downward within the resin bath with the aid of a displacement table. Here, however, the lithographic production of the target structure always takes place on the planar surface of the light-curing resin. Further methods for lithographically producing the target structure on a planar surface are disclosed in WO 01/96959 A2, DE 10 2008 054 582 A1, WO 2009/009208 A2, WO 2009/134762 A2 or U.S. Publication No. 2010/0003619 A1. Furthermore, DE 10 2012 010 635 A1 discloses a method for producing target structures on barrel-shaped or cylindrical planar initial structures.

U.S. Publication No. 2007/0175860 A1 discloses a method for producing target structures on non-planar microstructured surfaces by means of grayscale lithography. For this purpose, the lithography beam is modulated in order to obtain the desired exposure dose on the surface of the photoresist, or the lithography beam is refocused onto the non-planar surface. What is disadvantageous about this is that the use of grayscale lithography only makes it possible to produce planar structures having beveled surfaces.

WO 2006/138587 A2 discloses a method for producing partial regions in a photoresist, wherein the refractive index in the partial regions differs from other partial regions of the photoresist. However, effects such as a possible shading or blocking of the lithography beam during the production of the partial regions are totally disregarded here.

U.S. Pat. No. 8,846,160 B2 discloses a method for producing target structures by means of thermal polarization, wherein a sequential exposure of adjacent volume elements is carried out by means of a laser beam. For this purpose, a beam observation is carried out upstream of the lens, in particular in order to keep the shape of the volume elements as ideal as possible.

U.S. Publication No. 2013/0315530 A1 discloses a method for producing a planar and non-planar optical and photonic target structures. This involves producing different components having a different function in the same method step in order to improve their relative alignment with respect to one another. For this purpose, a hybrid direct writing method is used in order to produce the non-planar target structures using a first laser beam by means of two-photon absorption, preferably in the visible or infrared spectral range, and the planar target structures using a separate second laser beam by means of single-photon absorption, preferably in the ultraviolet spectral range.

D. Radtke et al., *Laser lithographic fabrication and characterization of a spherical artificial compound eye*, Optics Express 3067, March 2007, describe laser lithography on round, concave and convex surfaces for producing lens structures for artificial compound eyes. For this purpose, use is made of a positioning system which ensures that the lithography beam is always perpendicular to the surface to be written to and the optical path of the lithography beam during exposure is always the same, in order to avoid deformations in the exposed structure. This makes it possible to prevent the lithography beam from influencing the initial structure. What is disadvantageous about this, however, is a limitation to accessible angles of a six-axis system used therefor, which typically cannot exceed ±10°.

D. Radtke et al., *Laser lithography on non-planar surfaces*, Optics Express, Vol. 15, No. 3, pages 1167-1174, February 2007, describe methods and corresponding devices for lithographically producing a target structure, e.g., a diffractive Fresnel structure, on a non-planar surface, e.g., the surface of a convex lens element, wherein the lens element is coated in each case with a photoresist and the latter is then exposed in a patterned fashion by means of a suitably focused and guided laser beam. In this case, the exposure is carried out by virtue of the fact that the surface of the lens element to be exposed and patterned is permanently realigned by means of a movable exposure platform and is thus always perfectly oriented perpendicularly to the write beam. For this purpose, it is necessary for the topography and contours of the lens element to have been detected beforehand or to be present as a model data set.

H. Nisiyama et al., *SiO2-based nonplanar structures fabricated using femtosecond laser lithography*, Optics Express 17288, October 2008, describe laser lithography on convex $SiO_2$ lens elements as an initial structure for producing structures for micro-Fresnel lens elements which are transferred to the convex $SiO_2$ lens elements in a subsequent etching process. For this purpose, a lens having a small numerical aperture of 0.5 is used in order to write volume elements having a diameter of 2-3 µm. On account of the large radius of curvature of the $SiO_2$ lens elements of 200-400 µm, however, the lithography beam remains substantially unaffected by the initial structure.

Salter et al., *Focussing over the edge: Adaptive subsurface laser fabrication up to the sample face*; Opt. Express 20, 19978, August 2012, describe a method for correcting aberrations that occur during the optical patterning of waveguides in transparent substrates near the substrate edge. These aberrations are caused by the fact that the beam cone incident in the transparent material from the lens is split in the vicinity of the substrate edge in particular with the use of lenses having a high numerical aperture. The method described therein relates exclusively to the application of waveguide patterning within a solid transparent glass substrate having two mutually perpendicular faces having optical quality. This method is limited with regard to the write speed since the aberration correction of the phase fronts has to be determined individually for every point of the waveguide to be produced and has to be set with the aid of a comparatively slow spatial light modulator (SLM). Therefore, write speeds of 0.5 µm/s are mentioned, which are significantly below the values required for high throughput direct writing lithography methods.

SUMMARY

Against this background, this disclosure provides a method and a device for lithographically producing a target structure on a non-planar initial structure which at least partially overcomes the abovementioned disadvantages and limitations of the prior art.

In particular, disadvantageous effects of the interaction of the lithography beam with the non-planar initial structure are intended to be reduced to the greatest possible extent or completely avoided in order thus to enable the lithographic production of high-resolution, three-dimensional target structures with high precision on non-planar initial structures. In this case, the intention is to enable in particular a high write speed and thus a throughput suitable for industrial fabrication.

Hereinafter the terms "have," "encompass," "comprise" or "include" or any grammatical departures therefrom are used non-exclusively. Accordingly, these terms can refer either to situations in which, besides the features introduced by these terms, no further features are present, or to situations in which one or more further features are present. By way of example, the expression "A has B," "A encompasses B," "A comprises B" or "A includes B" can refer either to the situation in which, apart from B, no further element is present in A (i.e., to a situation in which A exclusively consists of B), or to the situation in which, in addition to B, one or more further elements are present in A, for example element C, elements C and D or even further elements.

Furthermore, it is pointed out that the terms "at least one" and "one or more" and grammatical modifications of these terms, if they are used in association with one or more elements or features and are intended to express the fact that the element or feature can be provided singularly or multiply, generally are used only once, for example when the feature or element is introduced for the first time. When the feature or element is subsequently mentioned again, the corresponding term "at least one" or "one or more" is generally no longer used, without restricting the possibility that the feature or element can be provided singularly or multiply. In the same connection, it shall be understood for purposes of this disclosure and appended claims that, regardless of whether the phrases "one or more" or "at least one" precede an element or feature appearing in this disclosure or claims, such element or feature shall not receive a singular interpretation unless it is made explicit herein. By way of non-limiting example, the terms "lithography beam," "test parameter," "correction parameter," to name just a few, should be interpreted wherever they appear in this disclosure and claims to mean "at least one" or "one or more" regardless of whether they are introduced with the expressions "at least one" or "one or more." All other terms used herein should be similarly interpreted unless it is made explicit that a singular interpretation is intended.

Furthermore, hereinafter the terms "preferably," "with preference," "in particular," "for example" or similar terms are used in conjunction with optional features, without alternative embodiments being restricted thereby. In this regard, features introduced by these terms are optional features, and the scope of protection of the claims, and in particular of the independent claims, is not intended to be restricted by these features. In this regard, the invention, as will be recognized by the person skilled in the art, can also be carried out using other configurations. In a similar way, features introduced by "in one embodiment of the invention" or by "in one exemplary embodiment of the invention" are understood as optional features, without alternative configurations or the scope of protection of the independent claims being intended to be restricted thereby. Furthermore, all possibilities of combining the features introduced by these introductory expressions with other features, be they optional or non-optional features, are intended to remain unaffected by these introductory expressions.

In a first aspect, this disclosure relates to a method for lithographically producing a target structure on a non-planar initial structure.

In this case, the "lithographically producing" refers to producing the target structure by exposing a photoresist in at least one exposure step by means of a lithography beam or by means of a plurality of lithography beams, which can also be referred to as "lithography beam bundle," and at least one subsequent development step. In association with this disclosure, the "lithography beam" denotes a light beam that is used in the method, also referred to as "lithography" to interact with the photoresist during the exposure step in such a way that the photoresist is changed such that after the development step has been carried out, the desired target structure is obtained in the developed photoresist. In this case, the term "interaction" denotes mutual action of the lithography beam on the photoresist and vice versa, whereby the respective properties thereof can be changed. By way of example, the lithography beam can change the solubility of the photoresist within a volume element of the photoresist, wherein the photoresist on the other hand can have an influence on a parameter of the lithography beam.

The "photoresist" comprises a light-sensitive material, preferably a polymer, in particular an acrylate, a methyl methacrylate or an Ormocer. Depending on absorption properties of the selected light-sensitive material, the exposure of the photoresist can be carried out with a wavelength in at least one spectral range of the electromagnetic spectrum, preferably the visible, infrared or ultraviolet spectral range. In this case, the exposure of the photoresist with the lithography beam can bring about a change in a property of the light-sensitive material, in particular a change in the optical properties of the photoresist, preferably the refractive index of the photoresist or a solubility of exposed partial regions of the light-sensitive material, wherein, depending on selected material for the photoresist, the solubility can decrease (so-called "negative photoresist") or increase (so-called "positive photoresist"). Depending on the type of change, in the development step following the at least one exposure step, the exposed partial regions of the light-sensitive material in the positive photoresist or the unexposed partial regions of the light-sensitive material in the negative photoresist can thus be dissolved away, whereby the target structure can be obtained.

In so-called "mask-based lithography methods," here at least one part of the surface of the photoresist can be exposed jointly in a planar fashion, wherein the unexposed partial regions are obtained by virtue of one or more masks being introduced into a beam path of the light impinging on the surface of the photoresist. However, this disclosure does not relate to said mask-based lithography methods, but rather is concerned with a so-called "direct writing lithography method," in which one lithography beam or a plurality of isolated lithography beams is or are directed in a focused fashion onto at least one volume element within the volume of the photoresist in such a way that the desired property of the light-sensitive material, in particular the solubility thereof, within the volume element is changed as a result of the exposure of the volume element with the at least one lithography beam. In this case, by means of so-called "single-photon lithography," the interaction of a single photon with the light-sensitive material can already suffice to change the desired property. In contrast thereto, however, in a further configuration of this disclosure, the interaction of two or more photons with the light-sensitive material in the context of so-called "two-photon lithography" or "multi-photon lithography" can be used to change the desired property. In the case of multi-photon lithography, a photon density proportional to the intensity is generated which is sufficient to ensure that two or more photons can participate in a reaction. This effect is referred to as "two-photon lithography" in the specific case of an interaction of two photons, and as "multi-photon lithography" in the general case of a plurality of photons. In one preferred configuration, the intensity required therefor can be generated by a highly focused, pulsed laser, such that the volume elements, also referred to as "voxels," produced in the photoresist as a result generally assume an ellipsoidal shape, which are preferably configured in such a way that they have the smallest possible aspect ratio of long to short semiaxis. Alternatively, at least two lithography beams can be aligned in such a way that they have narrowly delimited intensity maxima at a common focal point both in an axial direction and in a lateral direction. This configuration is also referred to as "stereo lithography" or, in the general case of a plurality of light beams, as "multi-beam lithography," wherein the terms "stereo lithography" or "multi-beam lithography" can refer both to a single-photon process and to multi-photon processes.

In the context of this disclosure, the term "initial structure" denotes an already existing surface which has a topography and which is provided at least partly with a volume of a photoresist in order to carry out a lithography method. By contrast, the term "target structure" denotes a structure or a partial region of a structure which is intended to be produced by application of the lithographic method. With regard to this disclosure, in addition a partial region of the target structure which has already been produced preferably by means of the present method can thus also be understood as an initial structure for producing a subsequent partial region of the target structure. Thus the term "initial structure" generally not only encompasses the structure present at the beginning of the implementation of the present method, but can also relate to a target structure that has already been partly produced by means of the present method. This can be advantageous in particular if partial regions of the target structure are produced progressively. Likewise, a completed target structure can in turn serve as an initial structure in a further implementation of the present method.

The present method makes it possible in particular to produce a target structure in the form of an optical element selected from the group comprising a refractive optical element, a diffractive optical element, a reflective optical element, an optical waveguide or a combination thereof. Further types of target structures are conceivable, however.

In association with this disclosure, the term "on" refers to the fact that at least one partial region of the desired target structure adjoins at least one partial region of the initial structure, whereby, as explained in greater detail below, the production of at least the partial region of the target structure adjoining the initial structure can influence at least that partial region of the initial structure which is adjacent thereto. In this case, the term "on" can denote in particular a partial region of the target structure which is applied on a partial region of the initial structure which is located on the surface in the beam direction. Alternatively or additionally, the term "on" can also denote in particular a partial region of the target structure which is produced laterally relative to a partial region of the initial structure in the beam direction. Other configurations are conceivable, for instance the production of an undercut.

As already mentioned the presented method relates to the production of a target structure on a non-planar initial structure. In contrast to a "planar structure," the surface of which has a topography which is extended only in two dimensions of space, the term "non-planar" initial structure denotes a three-dimensional structure having a surface which has an extent in all three dimensions of space in the form of a topography which serves as a carrier for the target structure. The initial structure can be in particular a non-planar patterned surface or, alternatively or additionally, an arrangement of discrete micro-engineering or micro-optical components. Furthermore, structures produced during the present method can likewise form the initial structure for further target structures. While in the case of a planar initial structure it is possible that the entire lithography beam can impinge on the planar surface of the planar initial structure without influencing, the impingement of the at least lithography beam on the non-planar initial structure can lead to an interaction of the at least one lithography beam or of a partial region thereof with the non-planar initial structure. As mentioned in the introduction, in this case transparent partial regions of the initial structure can effect a change in a wavefront of the lithography beam bundle or a partial region thereof and thus a deformation of the beam profile of the lithography beam or non-transparent partial regions of the initial structure can bring about a shading of parts of the lithography beam. Alternatively or additionally, the interaction of the lithography beam with the non-planar initial structure can also lead to an optically induced local change in the initial structure or partial regions of the target structure already produced.

The impingement of the at least one lithography beam on the non-planar initial structure can lead to a no longer negligible interaction of the at least one lithography beam with the non-planar initial structure in particular if the lithography beam has a high numerical aperture. The "numerical aperture," abbreviated to "NA," is a dimensionless number that relates to a focusing property of an optical element. In lithography lenses for two-photon lithography, the object-side NA is preferably more than 0.5, particularly preferably more than 0.8, in particular in places more than 1, if an immersion liquid is used or if the photoresist itself serves as an immersion liquid. This can have the effect that a cone described by the convergent lithography beam can substantially fill a complete region between the exposure optical unit and the focal point of the lithography beam and can thus interact with all partial regions of the initial structure that are situated in the region.

The present method for lithographically producing a target structure on a non-planar initial structure comprises the following steps, which are preferably carried out in the indicated order, beginning with step a) and ending with step d), wherein one or more, in particular successive, steps can also be carried out simultaneously at least in part:

a) detecting a topography of a surface of a non-planar initial structure;
b) using at least one test parameter for the lithography beam and determining an interaction of the lithography beam with the initial structure and the resultant change in the lithography beam and/or the target structure to be produced;
c) determining at least one correction parameter for the lithography beam in such a way that the change in the lithography beam and/or the target structure to be produced that is caused by the interaction of the lithography beam with the initial structure is reduced; and
d) producing the desired target structure on the initial structure by exposing the photoresist by means of the at least one lithography beam using the at least one correction parameter for the lithography beam.

In accordance with step a), the topography of the surface of the non-planar initial structure is detected. As already mentioned, the topography of an already existing surface can be detected in this case. Alternatively or additionally, in this case a partial region of the target structure which has already been produced preferably by means of the present method can be detected as initial structure for producing a subsequent partial region of the target structure, in particular if partial regions of the target structure are produced one after another over the course of time. In this case, the term "detecting the topography" refers to determining geometric data of the surface in a three-dimensional coordinate system, preferably a cartesian coordinate system. The use of a different coordinate system, in particular of a cylindrical coordinate system or of a polar coordinate system, may be advantageous, however, depending on the type of geometric configuration of the surface.

In one preferred configuration, known data from a model of the initial structure, in particular design data such as CAD data, can be used for detecting the topography of the non-planar initial structure. Alternatively or additionally, the topography of the non-planar initial structure can be determined metrologically by means of one or more measuring methods suitable for this purpose. Preferably, an optical measuring method can be used for this purpose, wherein an associated optical measuring unit can be configured in a manner integratable into the lithography unit or separately therefrom. As precise referencing as possible of the respective coordinate systems used for the measuring unit and the lithography unit can be particularly advantageous in this case. In the case of the optical measuring methods, detecting the surface topography can preferably be carried out using an immersion liquid, wherein the photoresist provided for producing the target structure can preferably simultaneously serve as the immersion liquid. However, it is likewise possible to dispense with the use of the immersion liquid. For optically detecting the topography of the initial structure, with preference it is possible to use an optical measuring method selected from the group comprising confocal measuring methods, interferometric measuring methods, measuring methods on the basis of trilateration, triangulation or strip projection, or methods of optical coherence tomography or combinations thereof. Alternatively or additionally, a camera can be used for this purpose.

In accordance with step b), at least one test parameter for the lithography beam is used in order to determine a resultant change in the target structure to be produced on account of an interaction of the lithography beam with the initial structure. In this case, the term "test parameter" denotes preset values for the lithography beam, wherein the values can arise from considerations familiar to the person skilled in the art. In particular, on the basis of comparable initial structures and target structures the person skilled in the art can define the values for the test parameters for the lithography beam in such a way that as a result the target structures are formed on the initial structures as far as possible in the desired manner. By way of example, the intensity of the lithography beam can be chosen to be slightly below the destruction threshold value of the photoresist, but above the change threshold value of the photoresist, in particular in order to achieve the highest possible resolution for the target structure. On the basis of a multiplicity of test parameters in accordance with which the lithography beam can be set, large degrees of freedom thus arise in this case, however, in order to be able to set the interaction of the lithography beam with the initial structure or the already written partial regions of the target structure to the magnitude desired by the person skilled in the art.

The use of the at least one test parameter for the lithography beam can take place during an exposure step which is carried out in the manner of a test and during which the lithography beam set with the test parameters, which lithography beam can also be referred to as "test beam" impinges on the photoresist. In particular, the test parameters, preferably optical power, pulse duration, wavelength, duty ratio or write speed, can be set in such a way that as far as possible no change in the photoresist occurs. While the exposure step is being carried out, the interactions of the lithography beam with the three-dimensional initial structure can be detected metrologically, for example by the global or spatially resolved detection of light which is scattered at the initial structure or reflected by the latter.

As an alternative or in addition thereto, the interaction of the lithography beam with the initial structure and the resultant changes in the lithography beam can be determined by indirect methods based in particular on a detection of luminescence radiation from a vicinity of the focal point, said luminescence radiation being optically excited by a test beam. The luminescence radiation can arise in particular as a result of fluorescence processes in the photoresist which are triggered by single- or multi-photon interactions of the test beam with the photoresist. For detecting the luminescence radiation, the device for lithographically producing the target structure on the non-planar initial structure, which device is described in greater detail below and is also referred to as "lithography system," can have for this purpose a unit for detecting the luminescence radiation, which can also be referred to as "luminescence detection unit." The term "luminescence radiation" hereinafter describes light emission brought about by interaction with the test beam from a vicinity of the focal point of the test beam, in particular in the form of fluorescence radiation or plasma emission. In this case, the term "detecting" the luminescence radiation can encompass a quantitative measurement of the luminescence power, which can be indicated in the form of absolute measurement values or can be referenced relative to the luminescence power of an undisturbed lithography beam.

The test beam used for exciting the luminescence radiation can preferably be generated by the same light source and beam shaping unit which is also used for the lithography, wherein the exposure parameters, such as, e.g., pulse power, pulse duration or write speed, can be chosen such that a crosslinking reaction does not occur here in the photoresist. Alternatively, it is also possible to use a separate test beam generated by a dedicated light source and a possibly associated beam shaping unit for exciting the luminescence radiation. In this case, the test beam can have a shape the same as or very similar to that of the lithography beam used for patterning or else can deviate from the shape of the lithography beam in a known manner, such that it is possible to deduce the interaction of the lithography beam with the non-planar initial structure from luminescence signals generated by the test beam. In this case, it is possible in addition to vary specific parameters, such as, e.g., the power, the amplitude and phase distribution or the wavelength, of the test beam during the test exposure of a specific volume element, wherein a luminescence power can be measured in the meantime. Information about the spatial regions in which an interaction of the test beam with the three-dimensional initial structure occurs can be determined in this way. For indirectly determining the interaction to be corrected of the lithography beam with the initial structure, it is possible to perform a complete or partial test exposure of the target structure. Alternatively or additionally, it is also possible to move only to selected support points within or outside the target structure with the test beam, with the aid of which the location-dependent interaction of the lithography beam with the initial structure can be estimated by means of interpolation methods and/or extrapolation methods.

For methods described here, such luminescence processes may be suitable in particular, which are based on excitation by multi-photon processes and in which the emitted luminescence power firstly occurs in a highly localized fashion and secondly is adversely affected very greatly by a deformation of the intensity distribution in the vicinity of the focal point of the lithography beam. It thus becomes possible, in particular, to directly determine the multi-photon absorption relevant to multi-photon processes in the photoresist. The detection of the luminescence radiation can be restricted locally to a greater or lesser extent to the vicinity of the focal point and can preferably be carried out by means of a camera or by means of a spatially selective detection method according to the principle of confocal microscopy. Alternatively or additionally, it is also possible for the entire luminescence power occurring along the lithography beam to be detected integrally. This can be carried out by a luminescence detection unit which, in one particular configuration of this disclosure, picks off light from the beam path of the lithography system by means of a beam splitter, for example. Other embodiments are conceivable, for example in the form of a luminescence detection unit to which the luminescence radiation can be fed via a light path that is completely separated from the lithography beam path. The detection of the luminescence radiation can be carried out in a spectrally resolved fashion, spectrally selectively or integrally over the entire spectrum. For this purpose, the luminescence detection unit can contain a spectrometer or selective filters that can separate in particular the luminescence radiation from the radiation that excites the luminescence. In one particular configuration, the luminescence radiation can preferably be brought about directly by multiphoton excitation of a photoinitiator. Although a luminescence of the photoinitiator is generally undesirable, since the emitted energy is no longer available for polymerization, in many cases the residual luminescence—unavoidable anyway—of customary photoinitiators on the basis of fluorene or benzophenone may be sufficient for a detection. In a further configuration, substances having luminescence properties suitable for the respective application, in particular, can additionally be added to the photoresist in order to improve the measurement result. Said substances can be colorants or optically active substances, which, in one particular configuration, can belong to the class of the squaraines or other polycyclic aromatic hydrocarbon compounds. Alternatively or additionally, the test exposure can initially be performed using a test medium which is different than the photoresist and which can have suitable luminescence properties, but which can be replaced by the envisaged photoresist before the lithographic production of the target structure.

For the case where the interaction of the lithography beam with the non-planar initial structure is determined indirectly by detecting the luminescence radiation from the focal region of the lithography beam, detecting the topography of the non-planar initial structure as provided in step a) can be greatly simplified and preferably comprise merely determining a global position of the three-dimensional initial structure in a coordinate system of the lithography system.

The described test exposure for detecting the luminescence radiation and the determination of a correction parameter on the basis thereof can also be repeated in iterative form in order thus increasingly to reduce a change in the target structure to be produced on account of the interaction of the lithography beam with the non-planar initial structure. In one particular configuration, on the basis of a first test exposure using a first test beam, it is possible firstly to determine a first correction parameter or a first set of correction parameters for the test beam, which is preferably geared to a spatially constant emission of luminescence power. The correction parameter or the set of correction parameters can then be used for a further test exposure, by means of which remaining variations of the luminescence power can be determined and used for determining a second correction parameter or a second set of correction parameters. By means of iteratively repeating this method step, preferably, the influences of the interaction of the test beam and the lithography beam with the non-planar initial structure can increasingly be able to be reduced.

Alternatively or additionally, it is possible to determine the correction parameter from the test exposure by taking account of differences in the propagation of the lithography beam and the propagation of the luminescence signal in order to be able to determine as accurate a correction parameter or set of correction parameters as possible for the lithography beam from observation of the luminescence signal.

As an alternative or in addition thereto, if both a model of the initial structure or of the already created parts of the target structure and a model of the desired target structure, in particular in the form of design data such as CAD data, are present, it is possible to carry out corresponding simulations or estimations on the basis of known parameters of the lithography system. Carrying out simulations makes it possible, in particular, to repeat steps b) and c) multiply, preferably in iterative form, primarily in order increasingly to reduce the change in the target structure to be produced on account of the interaction of the lithography beam with the initial structure.

In particular by means of comparison with the topography of the non-planar initial structure that is detected in step a), it is possible to determine during step b) changes that occur in the lithography beam on account of the interaction of the lithography beam with the initial structure or with the already produced partial regions of the target structure. In this context, it may alternatively or additionally be advantageous to determine to what extent the interaction of the lithography beam with the initial structure also actually changes the target structure. In the case of a partial shading of the lithography beam, it may already suffice, for example, to determine which part of the cross section of the lithography beam is shaded, in order to be able to adapt the power thereof. In this case, the term "change in the lithography beam" refers to at least one observable change in at least one parameter of the lithography system which occurs on account of the interaction of the lithography beam with the initial structure or with the already produced partial regions of the target structure. Without restricting generality, the change in the lithography beam can take place in this case in particular as a result of shading or reflection of the lithography beam at the initial structures or the already produced partial regions of the target structure or as a result of plasmonic amplification of the lithography beam at metallic regions on the initial structures or the already produced partial regions of the target structure. The changes in the lithography beam can, but need not, lead to a functionally relevant change in the target structure produced by means of this lithography beam.

In one preferred configuration, determining the changes in the at least one lithography beam or the resultant changes to the expected target structure can be carried out individually for each volume element to be exposed of the target structure. Alternatively, it is possible to consider a group of volume elements which have been subjected to the same or very similar impairments of the lithography beam. In this configuration, the changes can preferably be described as a function of one or more coordinates of a midpoint of a volume element. In a first case, this can apply to an edge which is non-transparent to the lithography beam and which brings about a shading such that this results in a decrease in the intensity at the focal point of the lithography beam and thus a deformation of the intensity distribution in a vicinity of the focal point depending on the distance from the edge. In a further case, this can apply to a vicinity of a transparent partial region of the initial structure in which a distortion of the lithography beam, hence a decrease in the intensity at the focal point of the lithography beam and thus a deformation of the intensity distribution in the vicinity occur. Furthermore, a displacement of the midpoint of the exposed volume element relative to the geometric focal point of the lithography beam can occur in addition to the decrease in the intensity at the focal point and the deformation of the intensity distribution in the vicinity of the focal point.

In accordance with step c), at least one correction parameter for the at least one lithography beam is determined. In this case, the term "correction parameter" denotes changed parameters for the at least one lithography beam which are determined in particular on the basis of the changes—detected during step b)—in the at least one lithography beam on account of the interaction thereof with the initial structure which bring about a change in the lithography beam and/or the target structure to be produced. Preferably, determining the correction parameter for the lithography beam can be carried out individually for each volume element to be exposed of the target structure. Alternatively, it is possible to consider a group of volume elements which have been subjected to the same or very similar impairments of the lithography beam. In this case, the at least one correction parameter is determined in such a way that the change in the lithography beam on account of its interaction with the initial structure is reduced in order in this way to be able at least partly, preferably completely, to compensate for an impairment of the lithography beam by the already existing initial structure and/or at least one already produced partial region of the target structure.

In one preferred configuration, the at least one correction parameter is determined by virtue of the fact that at least one adaptation of the lithography beam is carried out, wherein the at least one correction parameter can preferably be selected from the group comprising the adaptation
  of an optical power,
  of at least one wavelength,
  of a write speed,
  of a cross section,
  of an amplitude profile,
  of a phase profile, and/or
  of a position
of at least one region of the lithography beam, i.e., of the entire lithography beam bundle or only of a selected region thereof. In one preferred configuration, the setting of the at least one correction parameter for the lithography beam is carried out by means of the adaptation of a beam shaping unit traversed by the lithography beam, which is described in greater detail below.

In one preferred configuration, an adaptation of the optical power of the lithography beam can be carried out. As a result, in particular the effects of a partial distortion and/or a partial shading of the lithography beam can be at least partly compensated for. By way of example, the power of the lithography beam can be adapted in such a way that it remains slightly below the destruction threshold value of the photoresist, but above the change threshold value of the photoresist, even if the lithography beam is at least partly shaded and/or distorted. By way of example, the effects of a transparent or non-transparent edge interacting with the lithography beam can be compensated for by increasing the optical power of the lithography beam as the lithography beam approaches the edge. For the case where a pulsed lithography beam is used, it is possible to adapt the optical power of the lithography beam by choosing a duty ratio, a repetition rate, a shape and/or a duration of the optical pulses used therefor. Such a type of adaptation may be advantageous in particular in the case of multi-photon processes that depend very sensitively on a peak power of the optical pulses used.

In a further preferred configuration, an adaptation of the write speed at which the lithography beam sweeps over the photoresist in a lateral direction can be carried out. In particular by adapting the speed of movement of the focal point of the lithography beam in the photoresist, it is possible—with constant optical power—for the dose deposited by means of the lithography beam in the photoresist to increase as the speed decreases.

In a further preferred configuration, an adaptation of the cross section of the lithography beam can be carried out. In many cases, it may be desirable to shade a region of the beam path that is changed by the topography of the initial structure, for example in order to prevent damage to the initial structure as a result of an intense irradiation at a lithography wavelength or in order to avoid changes in the polymerization process in the photoresist as a result of interference between the undisturbed region of the lithography beam and the region of the lithography beam that is changed by the initial structure. This may be advantageous in particular if optically high refractive index, highly absorbent or highly reflective, for example metallic, elements of the initial structure interact with the lithography beam. In this case, as a result of local boostings of the electric field or as a result of absorption-induced heating, a decomposition of the photoresist can occur, which leads to blistering or to a micro-explosion and thereby renders the target structure and/or the initial structure unusable. In a similar manner, a reduction of the cross section of the lithography beam can effect a partial shading of the lithography beam, which can contribute to attenuating or to avoiding interference effects caused by initial structures having partial regions that are reflective at the lithography wavelength. For this purpose, by way of example, the shape of the lithography beam can be changed in such a way that as far as possible no or at most a small spatial overlap between the incident lithography beam and a lithography beam generated by the reflective partial regions can occur.

In a further preferred configuration, an adaptation of a positioning of the lithography beam in relation to a structure in the photoresist can be carried out. The interaction of the lithography beam with the initial structure can lead to a distortion of the beam path and thus to a deviation of the focal point of the distorted lithography beam from a nominal focal point of a fictitious lithography beam propagating in an undisturbed fashion in the photoresist. This deviation can be compensated for, for example, by virtue of the fact that the position of the nominal focal point belonging to the fictitious undisturbed lithography beam can be corrected by driving a beam shaping unit configured for influencing an amplitude or phase distribution of the lithography beam. Alternatively, the deviation of the focal point of the distorted lithography beam from the nominal focal point of a fictitious lithography beam propagating in an undisturbed fashion in the photoresist can be compensated for by means of a corresponding adaptation of the beam position by means of scanning mirrors of the lithography system.

In a further preferred configuration, an adaptation of at least one lithography wavelength can be carried out. As already mentioned, undesired interference between incident and reflected light can occur in the case of an initial structure having partial regions that are highly reflective at the lithography wavelength $\lambda_1$. These resultant changes in the exposed structure can be attenuated or prevented by the one dynamic adaptation of the lithography wavelength $\lambda_1$ or by the use of additional lithography wavelengths $\lambda_2$, $\lambda_3$. By way of example, it is possible to adapt the lithography wavelength $\lambda_1$ during the exposure step such that no or only a slight reflection of the lithography beam by the initial structure takes place. In the case of dielectric layer stacks, the lithography wavelength $\lambda_1$ can be chosen in such a way that it penetrates through the layer stack and thus has only a low reflection. A similar effect can be achieved if a second wavelength $\lambda_2$ is used which experiences no or only a very low reflection by the initial structure. Alternatively or additionally, a wavelength $\lambda_3$ can also be chosen such that it is reflected in a highly phase-shifted fashion in comparison with the first lithography wavelength $\lambda_1$. What can be achieved as a result is that the spatial changes in the intensity that arise as a result of the interference at the first lithography wavelength $\lambda_1$ are partly or completely compensated for. In this case, further wavelengths can be used either dynamically and variably over the course of the lithography method or statically.

In a further preferred configuration, the adaptation can concern only a partial region of the lithography beam. The change in the intensity distribution in a volume element as a result of the interaction of the lithography beam with the initial structure can be wholly or partly compensated for by a change, in particular a distortion, of the lithography beam or a region of the lithography beam. For this purpose, the beam shaping unit can impress a spatially variable amplitude modulation and/or phase modulation on the write beam, which is adapted to the changes to be expected for the respective volume element or the selected group of volume elements. Alternatively or additionally, a partial region of the lithography beam can also be completely blocked in this case.

The adaptation can concern individual measures or combinations thereof. In order to quantify the changes in the lithography beam and the resultant changes in the intensity distribution at the focal point, besides the surface topography, for this purpose it is possible to use further information, for example about the composition and optical properties of the partial regions of the initial structure which may influence the lithography beam. As already mentioned, it is possible to determine and set the correction parameter separately for each volume element or for an entire group of volume elements which have been subjected to similar impairments. Determining and setting the correction parameter for groups of volume elements may be appropriate in particular if the setting of the correction parameter takes an amount of time comparable to or more than that taken by the exposure of a volume element. In this case, an individual adaptation of the correction parameter for each volume element may inevitably lead to a great reduction of the write speed and thus the throughput. That may preferably apply if the correction parameter is set by means of a spatial light modulator (SLM), the response times of which are comparable to or significantly greater than the exposure times of a volume element. In an implementation of the correction methods according to this disclosure, the correction strategy and in particular the groups of the volume elements addressed by a single value of the correction parameter can be chosen such that the write speed is preferably more than 0.1 mm/s, particularly preferably more than 1 mm/s, and very particularly preferably more than 10 mm/s.

In one particular configuration, two correction parameters can also be varied simultaneously, wherein for a first correction parameter an individual adaptation is performed for each individual volume element, while the values for a second correction parameter are maintained for a group of volume elements. This may be appropriate if the setting of the first correction parameter can be carried out rapidly, while the setting of the second correction parameter takes more time. In one preferred configuration, with the first, rapidly settable correction parameter, a continuous variation of the lithography power can preferably be performed, while with the second, slowly settable correction parameter, an adaptation of an amplitude distribution and/or of a phase distribution in the beam cross section, said adaptation being constant in sections, can be performed and be applied to an entire group of volume elements without any change. This configuration can enable in particular the combination of an SLM for shaping the beam cross section in sections with a rapid adaptation of the lithography power by way of the modulation of the light source or by way of an external optical modulator.

In a further particular configuration, in particular in the case of target structures having large volumes, the target structure can be decomposed into an inner partial region and into a near-surface partial region, wherein different correction parameters are used for the inner partial region and the near-surface partial region. For the near-surface partial region, in this case the correction parameter can be determined under the condition of the greatest possible dimensional accuracy and surface quality of the structure and can therefore be selected and optimized with regard to a shape of the volume element that is advantageous therefor, while the condition of a high write speed, as homogeneous a polymerization as possible and/or a low algorithmic complexity is applied for the inner partial region of the target structure.

In one particular configuration, steps b) and c) can be repeated multiply, in particular in order to achieve an iterative approximation to correction parameters that are as advantageous as possible. In this way, it is possible to achieve a better compensation of the changes in the lithography beam on account of the interaction with the initial structure.

In accordance with step d), exposing the photoresist is carried out by means of the at least one lithography beam using the at least one correction parameter for the lithography beam, whereby the desired target structure is produced on the initial structure. In this case, tracking the location-dependent lithography parameters can be carried out continuously together with the movement of the lithography beam relative to the non-planar initial structure or, alternatively, in sections such that groups of volume elements are exposed using the same correction parameters.

In one preferred configuration, it is advantageous to modify a region, part or partial region of the lithography beam that is changed by the non-planar initial structure by means of a setting of the beam shaping unit and at the same time to influence the region, part or partial region of the lithography beam that is not changed by the non-planar initial structure in such a way as to result in a desired geometric property in the region of the volume element to be produced. In this case, the at least one correction parameter can preferably be determined in accordance with the following substeps i) to iii):

i) determining a first region of the lithography beam, in which the lithography beam reaches a midpoint of the volume element without interaction with the non-planar initial structure;

ii) determining a second region of the lithography beam, in which the lithography beam interacts with the non-planar initial structure on a path to the midpoint of the volume element; and iii) modifying the first region or the second region of the lithography beam by a setting of at least one partial region of the beam shaping unit.

In one preferred configuration, substep iii) can comprise both blocking the second region of the lithography beam by means of a setting of a second partial region of the beam shaping unit and determining a setting for the first partial region of the beam shaping unit in such a way that an intensity maximum of the second region of the lithography beam occurs at the midpoint of the volume element.

In particular, determining a setting of the at least one partial region of the beam shaping unit during substep iii) can be carried out in such a way that a geometric property, in particular a quality criterion in the form of a test metric, is defined for the intensity distribution established in the region of the volume element. In this case, the desired geometric property can be dependent on the lithography method used and can provide a defined type of a spatial extent of the intensity maximum around the midpoint of the volume element, for example a full width at half maximum of the volume element. The associated setting of the beam shaping unit can then be determined numerically, e.g., on the basis of a suitable model. For this purpose, by way of example, it is possible to define a quality criterion which evaluates a given geometric property by means of a real number, wherein the quality criterion can be optimized by suitable direct or iterative methods. In the case of methods based on two-photon polymerization, it is desirable, for example, to obtain an intensity distribution that is as concentrated as possible spatially with the highest possible peak intensity and the smallest possible spatial extent in all three spatial directions. For this purpose, it is possible to use, e.g., a sum of second order central moments of the intensity distribution as a target variable to be minimized.

In an alternative configuration, in particular with knowledge of the changes occurring in the second region of the lithography beam, substep iii) can be carried out in such a way that a setting of the second partial region of the beam shaping unit that compensates for the change is performed. In this case, the exact setting of the second partial region can likewise be geared to optimizing the quality criterion derived from the geometric property of the volume element. Accordingly, the optimization can then also extend over the entire cross section of the lithography beam, wherein the effect of the interaction of the lithography beam with the non-planar initial structure is taken into account by a suitable model. Given a suitable design of the beam shaping unit, it is furthermore possible to shift optical power from the first region into the second region of the lithography beam.

In all of substeps i) to iii), further correction parameters may be determined besides the setting of the beam shaping unit. In this regard, it may be advantageous to combine the setting of the beam shaping unit with an adaptation of the optical power in the lithography beam, said adaptation being coordinated with these settings, or with an adaptation of pulse durations or duty ratios.

By means of substeps i) to iii), it is possible to determine the setting of the beam shaping unit separately for each volume element or, alternatively, for a group of volume elements. For determining the second region, it is advantageous in the latter case to ensure that the second region of the lithography beam interacts with the non-planar initial structure for none of the volume elements from the affected group of volume elements. This is appropriate for example if the target structure has large regions having almost identical solid-angle-dependent profiles or the exposure duration for individual volume elements is significantly shorter than the time required for the reconfiguration of the optical beam shaping unit. This last may typically be the case if the lateral positioning of the lithography beam is carried out by means of a mirror-based beam scanner having response times in the sub-millisecond range, while the elements used for beam shaping, such as, e.g., a spatial light modulator (SLM), have response times in the millisecond range.

In a further aspect this disclosure relates to a device—also referred to as "lithography system"—for lithographically producing a target structure on a non-planar initial structure by exposing a photoresist by means of at least one lithography beam according to a method according to this disclosure. In this case, the device at least comprises:

- a lithography unit for generating a lithography beam and for positioning the lithography beam within a photoresist;
- a beam shaping unit configured for influencing an amplitude and/or phase distribution of the lithography beam; and
- a data processing unit configured for driving the lithography unit and the beam shaping unit, wherein the data processing unit is furthermore configured to store structure data of the structure to be produced and correction data for correcting the change in the lithography beam that is caused by an interaction of the lithography beam with the non-planar initial structure.

The lithography unit thus serves for generating the lithography beam and for positioning the lithography beam within the photoresist, which can simultaneously also be used as an immersion liquid. In this case, the positioning of the lithography beam can be carried out by the movement of the lithography beam, e.g., by means of beam scanners. Alternatively or additionally, a displacement of the initial structure can be performed by means of a displacement unit, in particular a displacement table on which the initial structure is arranged. The lithography unit can comprise an optical light source having a controllable output power, e.g., a light source having a constant output power and a downstream optical modulator. In this case, it may be advantageous if the movement of the lithography beam and the adaptation of the optical power guided in the beam can be synchronized. This makes it possible, for example, as the focal point approaches an edge of the non-planar initial structure that changes the lithography beam, to increase the optical power in the lithography beam upon approaching the edge.

The term "beam shaping unit" denotes an optical system configured to set the amplitude and phase distribution of the lithography beam. The beam shaping unit, if correspondingly short response times are present, can preferably be driven synchronously with the beam movement. Alternatively, it can be operated such that the same settings of the beam shaping unit are used for partial regions of the target structure. The beam shaping unit can preferably comprise at least one controllable optical element, in particular selected from the group comprising spatial light modulators (SLM), micromirror arrays, liquid crystal arrays, deformable mirrors, or controllable diaphragms. Furthermore, it can comprise other optical systems having controllable or non-controllable optical components, such as, e.g., lens elements, mirrors, diffraction gratings, diffractive optical elements or holograms. In this case the optical elements can be operated in reflection or transmission. In one preferred configuration, the beam shaping unit can consist of a spatial light modulator, which is fitted spatially upstream of the lithography lens and allows a modulation of amplitude and phase in the cross section of the lithography beam. Alternatively, the beam modification unit can be fitted spatially upstream of an optical scanner such that the interaction of the lithography beam with the beam shaping unit remains unaffected by a movement of the lithography beam.

The data processing unit is configured to drive the optical lithography unit and the beam shaping unit. For this purpose, the data processing unit has a data memory in which are stored structure data of the target structure to be produced and correction data for correcting the disturbances brought about by the interaction of the lithography beam with the three-dimensional initial structure. Depending on the storage capacity and computing power of the data processing unit, it is possible to store the structure data and the correction data for the complete target structure or, alternatively, the structure data and/or the correction data are stored only for in each case a partial sections of the target structure and are reloaded as necessary from an external data processing unit.

The correction data can be stored directly as control data for the optical lithography unit and/or for the beam shaping unit. Preferably, for this purpose the correction data comprise the correction parameters determined in accordance with step c). Detecting the non-planar initial structure in conjunction with a model of the lithography system can be carried out in this case by the data processing unit of the lithography system and/or by the external data processing unit. Alternatively or additionally, the structure data and/or correction data can be stored in a data memory, from which data the data processing unit can generate control data for the optical lithography unit and/or for the beam shaping unit.

For processing known data from a model of the initial structure, in particular design data such as CAD data, for carrying out the process of detecting the topography of the non-planar initial structure as described in step a), it is possible to use the data processing unit and/or the external data processing unit. As an alternative thereto, it is also possible to use metrological methods. For this purpose, the lithography system can additionally have an optical measuring unit. In this case, the optical measuring unit can preferably be based on the principle of confocal microscopy, optical coherence tomography, triangulation, strip projection, interferometry or optical time-of-flight measurement. Alternatively or additionally, the optical measuring unit can comprise a camera. Furthermore, it is possible, for metrologically detecting the surface topography of the three-dimensional initial structure, to use at least in part the same optical elements that are also used for lithographically producing the target structure. In an advantageous manner, imaging aberrations of the optical units of the lithography system and/or of the optical measuring unit can thus be at least partly compensated for.

For further details with regard to the present device, reference is made to the description of the method according to this disclosure.

Advantages of this Disclosure

This disclosure has a series of advantages over the methods and devices for lithographically producing a target structure on a non-planar initial structure that are known from the prior art. The object on which this disclosure is based occurs wherever non-planar high-resolution target structures are intended to be produced on existing initial structures with high precision and dimensional fidelity. Besides applications in the field of micro- and nanotechnology, use is also conceivable in a broad area of laser material processing, e.g., laser metal deposition, on prefabricated non-planar initial structures.

Methods according to this disclosure can be used, e.g., in the production of photonic wire bonds in accordance with U.S. Pat. No. 8,903,205 B2 or U.S. Pat. No. 9,034,222 B2, in particular if the intention is to realize a photonic wire bond which directly adjoins the vertical facet of an integrated optical chip. This is the case for example when linking facet emitting lasers or semiconductor amplifiers or silicon-photonic chips with correspondingly prepared coupling locations on the chip edge.

Problems similar to those that arise when linking photonic wire bonds to vertical facets of semiconductor-based integrated optical chips also arise in the case of coupling to optical fibers, to vertical facets of glass-based chips or to planar or non-planar, in particular curved, side faces of bodies which are optically transparent at the lithography wavelength, such as, e.g., lens elements. However, a complete shading of that region of the lithography beam which interacts with the non-planar initial structure does not necessarily occur here, since the associated partial region of the lithography beam can penetrate through the transparent, non-planar initial structure. The material of that partial region of the non-planar initial structure which interacts with the lithography beam generally differs with regard to refractive index from the photoresist usually used as an immersion liquid, which can lead to a disturbance of phase fronts in the region of the lithography beam and thus to a deformation of the intensity distribution in the vicinity of the focal point of the lithography beam.

Methods according to this disclosure can be used not only in the production of photonic wire bonds, but also for lithographically producing microlenses on three-dimensional initial structures such as, e.g., facet emitting integrated optical chips. In order to be able to influence properties of microfluidic channels and systems, it may furthermore be expedient to modify the surface of these non-planar structures. A partial impairment of the lithography beam can occur here, which can be attenuated or compensated for with the aid of the measures described above.

Further fields of application may result from the fact that the target structures produced during a lithography process serve as initial structures for subsequent processes. This is advantageous in particular if a liquid photoresist is used. In this case, the structures to be fabricated can be designed such that as early as during the lithography method they are preferably self-supporting, that is to say that newly written structures preferably adjoin the initial structure or already written partial regions of the target structure in order to prevent a displacement of partial regions. Therefore, in many cases, complex structures cannot be constructed in slices, but rather can be fabricated by the present method step by step before other parts of the target structure and thus simultaneously form the initial structure for future parts of the target structure.

BRIEF DESCRIPTION OF THE DRAWINGS

The above-mentioned aspects of exemplary embodiments will become more apparent and will be better understood by reference to the following description of the embodiments taken in conjunction with the accompanying drawings.

The exemplary embodiments are illustrated schematically in the following figures. In this case, identical reference numerals in the figures designate identical or functionally identical elements or elements that correspond to one another with regard to their functions.

FIGS. 9a-9b show a comparative example in which a target structure that has already been produced interacts with a region of the lithography beam during the exposure of a subsequent target structure: 9a) schematic illustration of the method for producing the target structure, 9b) electron microscope recordings of a target structure not produced according to this disclosure, wherein the target structure that has already been produced influences the lithography beam in such a way that the desired target structure is not obtained;

DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of this disclosure.

Figure 1:
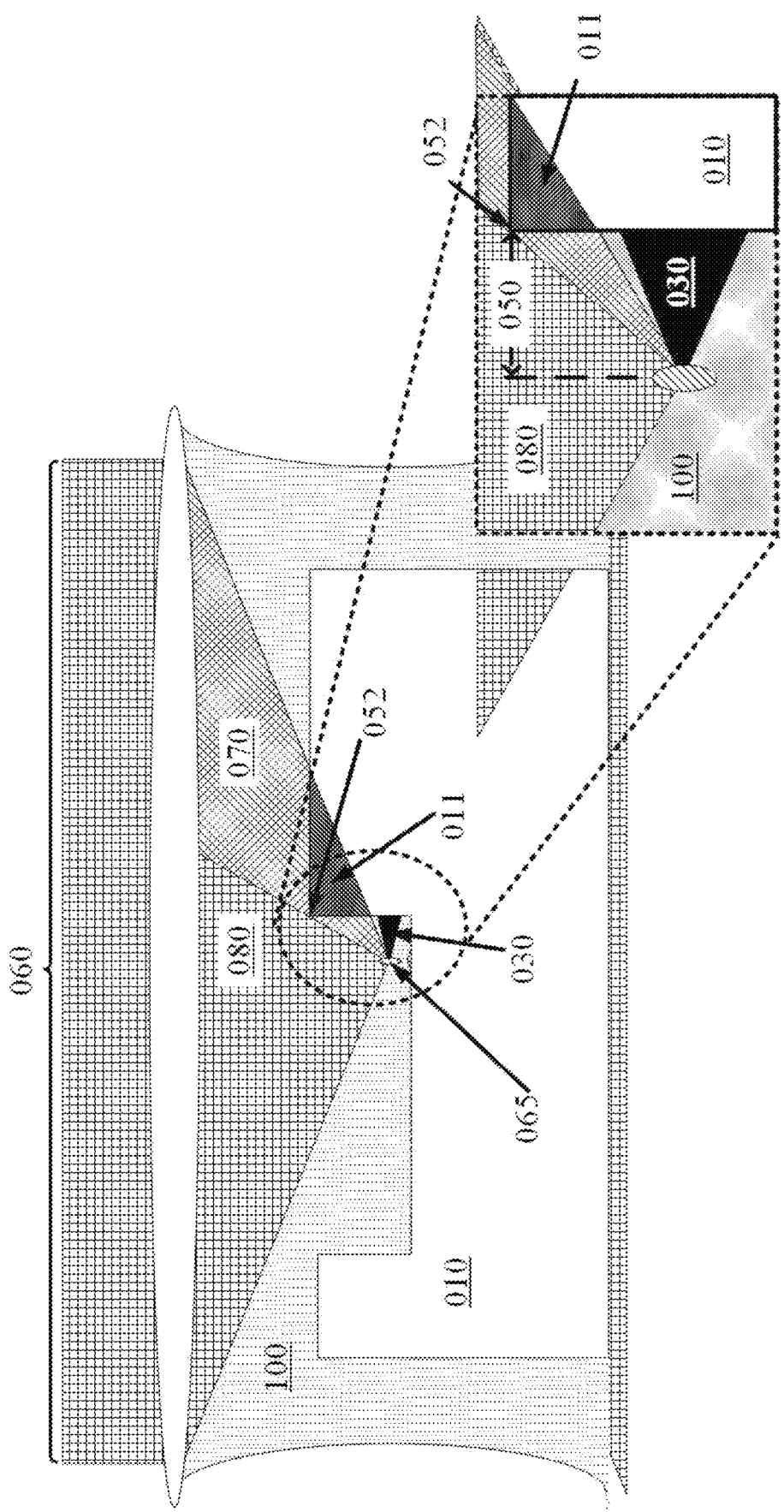
FIGS. 1a-1c show schematic illustrations of a direct writing optical lithography method using two-photon polymerization:
    1a) object of this disclosure; 1b) illustration of progressive production of partial regions of the target structure; and 1c) one exemplary embodiment of a solution according to this disclosure by adaptation of the beam cross section.
Figure 1B:
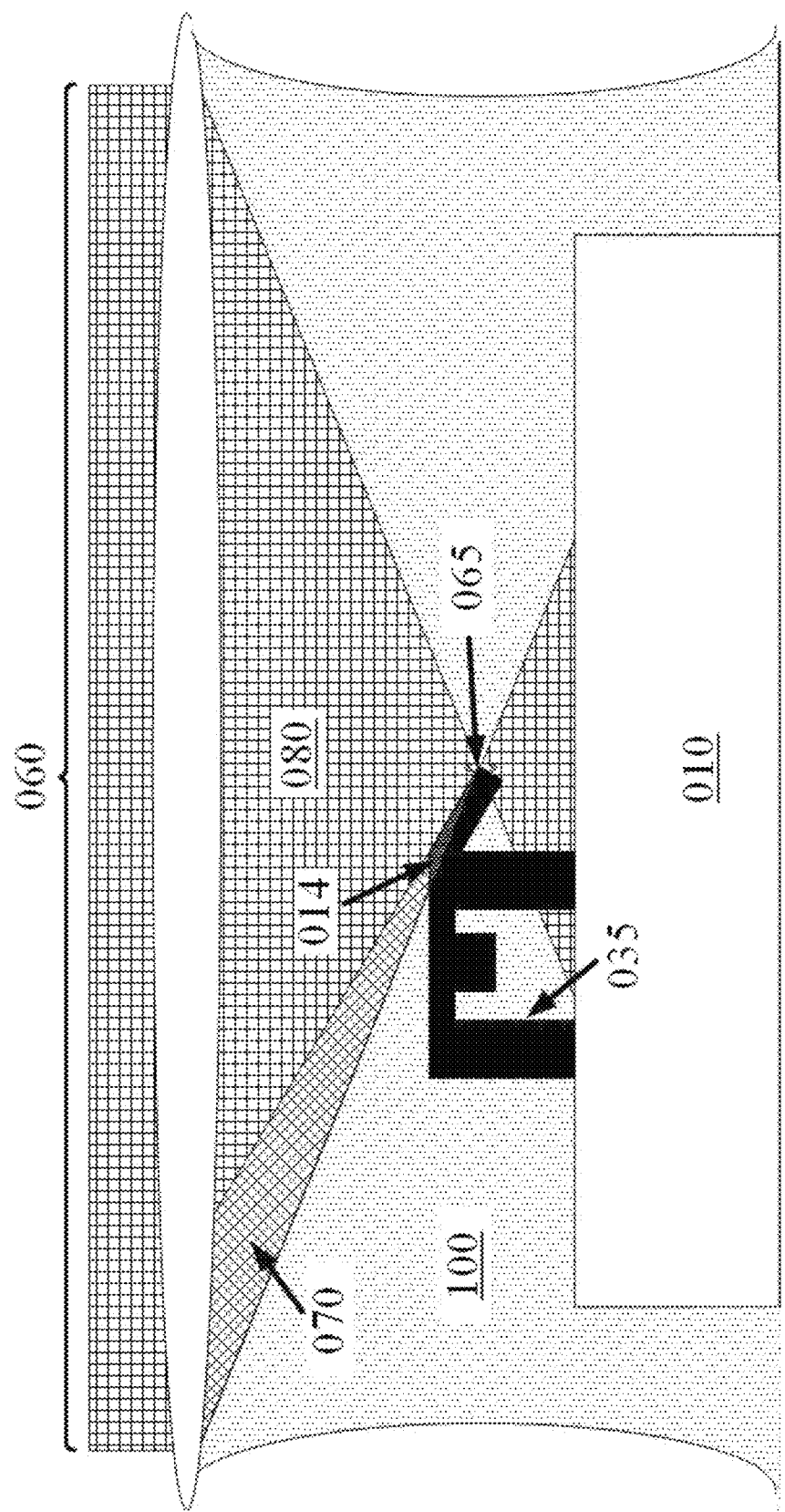

FIG. 1 schematically shows a solution according to this disclosure for achieving the underlying object on the basis of the example of a direct writing optical lithography method based on two-photon polymerization.

In order to produce a target structure 030 composed of a photoresist 100 on a non-planar initial structure 010, as illustrated in FIG. 1 a), a highly focused lithography beam 060 having a high numerical aperture is used, wherein the photoresist 100 can preferably simultaneously be used as an immersion liquid. In this case, a region 070 of the lithography beam 060 impinges on a partial region 011 of the non-planar initial structure 010 and interacts with the latter. Firstly, this can lead to a change in the intensity distribution at a focal point 065 of the lithography beam 060 and thus to a change in the target structure 030 thus produced. Secondly, the interaction of the lithography beam 060 with the non-planar initial structure 010 can lead to a local, optically induced change in the partial region 011 of the initial structure 010.

As shown in FIG. 1 b), in a manner similar to the non-planar initial structure 010, parts 014 of already produced partial regions 035 of the target structure 030 can also interact with the lithography beam 060 and change the latter, in particular if the lithography beam 060 is linked to an already produced partial region 035 of the target structure 030. In this case, the already produced partial region 035 of the target structure 030 can be understood as a non-planar initial structure 010 for the production of a subsequent partial region 035 of the target structure 030.

The solution according to this disclosure as illustrated schematically in FIG. 1 c) provides for dynamically adapting the parameters of the lithography beam 060, such that the changes caused by the interaction with the non-planar initial structure 010 are reduced or completely avoided. In a first embodiment, the adaptation can be carried out by means of a change in an optical power in the lithography beam 060 which compensates for a decrease in the intensity of the lithography beam 060 at the focal point 065, said decrease being caused by the interaction with the non-planar initial structure 010. Furthermore, a cross-sectional shape of the lithography beam 060 can be adapted in such a way that an interaction with the non-planar initial structure 010 is avoided or the changes in the lithography beam 060 that result from such an interaction are wholly or partly compensated for. This can preferably be achieved by means of a beam shaping unit 110 that is additionally introduced into a beam path of the lithography beam 060. By driving the beam shaping unit 110 in a manner dependent on a position of the lithography beam 060 within the non-planar initial structure 010, it preferably becomes possible to completely darken the region 070 of the lithography beam 060 that interacts with the initial structure 010. This may be expedient in particular if optically induced modifications in the partial region 011 of the initial structure 010 that interacts with the region 070 can thus be avoided.

Alternatively, in a partial region 113 of the beam shaping unit 110, an amplitude and/or phase distribution which can at least partly compensate for the changes brought about by the interaction with the partial region 011 can be impressed on the region 070 of the lithography beam 060. This may be expedient for example if the partial region 011 comprises a material which is transparent to the lithography wavelength and which differs in refractive index from the photoresist 100 simultaneously used as an immersion liquid and therefore causes a change in a phase of the transmitted light. Such a change in phase can have the effect, in particular, that interference occurs between the changed regions 070 of the lithography beam 060 and regions 080 of the lithography beam 060 that are unchanged on account of the topography 020 of the initial structure 010, which can result in a formation of secondary maxima of the intensity distribution at the focal point 065 of the lithography beam 060 and thus an uncontrolled deformation of an exposed volume element 040.

With regard to the region 080 of the lithography beam 060 that is not impaired by the topography 020 of the initial structure 010, in one particular embodiment, it is possible to choose a neutral setting of the beam shaping unit 110 which allows passage of the light in the partial region 112 without amplitude or phase modulation. Alternatively, it is possible to generate a spatially variable amplitude and/or phase modulation that leads to a desired intensity distribution in the volume element 040 to be exposed. The beam parameters used for compensating for the changes, such as, e.g., the optical power or the settings of the beam shaping unit 110, can either be determined separately for each volume element 040 to be exposed or, alternatively, the same settings are used for the exposure of a complete partial structure. A corresponding model of the lithography system 090 and/or of the non-planar initial structure 010 can preferably be taken as a basis for determining the respective parameters.

In a further implementation according to this disclosure, both a modification of an amplitude distribution and/or of a phase distribution of the lithography beam and a variation of a total power of the lithography beam can be performed by means of the beam shaping unit 110. In one technical implementation, in this context the challenge often arises that the setting of the modification—based for example on an SLM—of the amplitude distribution and/or of the phase distribution can only be performed comparatively slowly with response times comparable to or significantly longer than the exposure times of a volume element, while the variation of the total power can be carried out significantly faster than the exposure of a volume element. This challenge can be resolved by combining a continuous variation of the lithography power, this variation being determined individually for each volume element, with a slower adaptation—constant in sections—of the amplitude distribution and/or of the phase distribution in the beam cross section, which can be applied to an entire group of volume elements without change. This embodiment can make it possible in particular to combine an SLM for shaping the beam cross section in sections with and a fast adaptation of the lithography power by means of a modulator.

Figure 2:
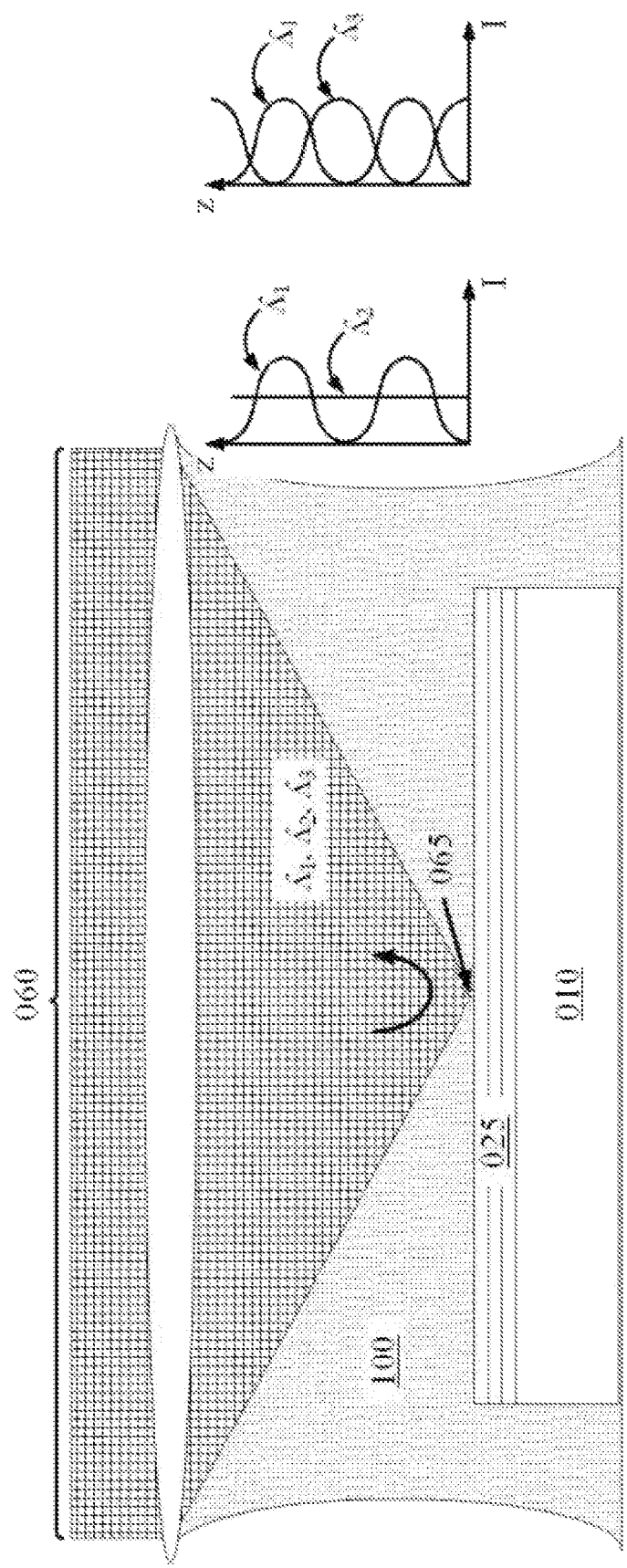
FIGS. 2a-2c show schematic illustrations of a direct writing optical lithography method using two-photon polymerization on highly reflective partial regions of a non-planar initial structure:
    2a) object of this disclosure; 2b) one exemplary embodiment of a solution according to this disclosure by adaptation of an optical spectrum used for the polymerization; 2c) a further exemplary embodiment of a solution according to this disclosure by an adaptation of the beam profile.

FIG. 2 shows the method according to this disclosure for the case in which interference occurs on highly reflective initial structures 010.

In this respect, FIG. 2 *a*) schematically illustrates the associated object. In one particular embodiment in which near-surface partial regions 025 of the initial structure 010 are configured to be highly reflective at the lithography wavelength, interference between the incident and the reflective lithography beam 060 and thus at least partly standing optical waves can occur. In this case, intensity minima can occur in the vicinity of the surface of the initial structure 010, at which intensity minima an intensity threshold required for the polymerization of the photoresist 100 can no longer be attained. This is illustrated here by way of example by a $\sin^2$-shaped profile of the intensity I as a function of a vertical coordinate z. A formulated object of this type can occur for example in the lithographic production of 3D structures on emission facets of surface emitting lasers (*Vertical Cavity Surface Emitting Lasers*, VCSEL).

FIG. 2 *b*) schematically depicts a solution according to this disclosure for achieving this object by means of an adaptation of the optical spectrum used for the polymerization. For this purpose, use is made of additional lithography wavelengths $\lambda_2$ and/or $\lambda_3$ which either, as illustrated for the wavelength $\lambda_2$, do not reflect or, as explained on the basis of the example of the wavelength $\lambda_3$, are reflected with a great phase shift in comparison with the first lithography wavelength $\lambda_1$. In this case, the use of further wavelengths can be implemented either dynamically and, over the course of the lithography method, variably or statically.

As shown schematically in FIG. 2 *c*), the problem can alternatively or additionally be solved by means of an adaptation of the beam profile according to this disclosure. The lithography beam 060 can be changed by means of the beam shaping unit 110 in such a way that the partial regions 025 affected by destructive interference is reduced in size or completely eliminated. This can preferably be achieved by virtue of the fact that an oblique incidence of the lithography beam 060 on the initial structure 010 can be produced by means of a partial shading of the lithography beam 060.

Figure 3:
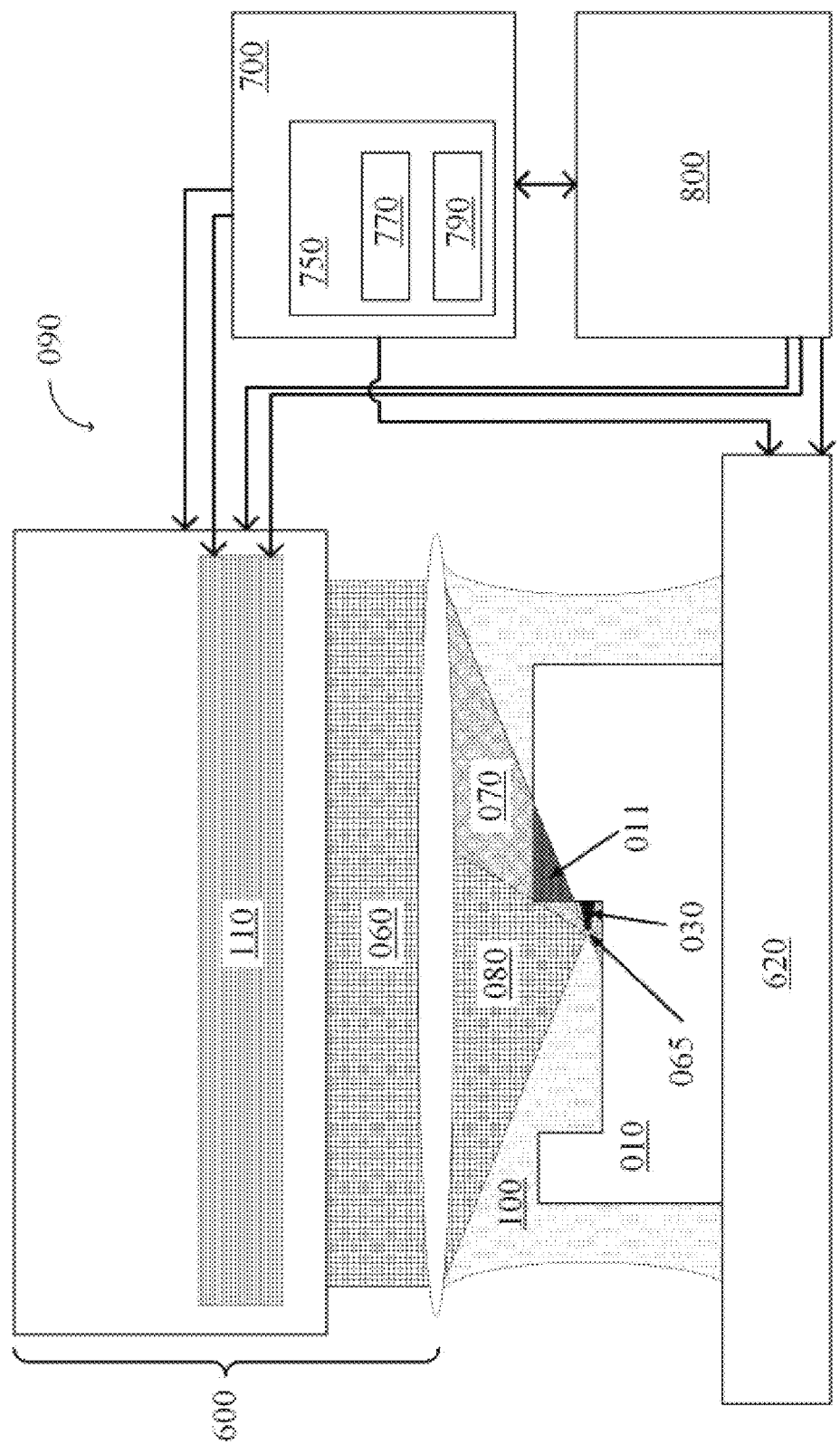
FIG. 3 shows a schematic illustration of one exemplary embodiment of a device (lithography system) according to this disclosure for lithographically producing a target structure on a non-planar initial structure.

FIG. 3 schematically shows an illustration of one particularly preferred exemplary embodiment of a device according to this disclosure for lithographically producing the target structure 030 on a non-planar initial structure 010, which is also referred to hereinafter as lithography system 090. In this case, the lithography system 090 comprises an optical lithography unit 600 for generating the lithography beam 060 and for positioning the lithography beam 060 highly accurately within the photoresist 100, which, in this preferred embodiment, can simultaneously be used as an immersion liquid. In this case, the positioning of the lithography beam 060 can be carried out either by a movement of the lithography beam 060, preferably by means of beam scanners, or, alternatively, by a displacement of the initial structure 010 with a locally stationary lithography beam 060 by means of a displacement table 620 having the highest possible accuracy. Combinations of these embodiments are conceivable.

In addition, the lithography system 090 comprises the beam shaping unit 110, configured to change the amplitude and/or phase distribution of the lithography beam 060, and also a data processing unit 700 configured to drive the optical lithography unit 600 and the beam shaping unit 110. The data processing unit 700 can preferably have a data memory 750, in which are stored both structure data 770 of the target structure 030 to be produced and correction data 790 for correcting the changes brought about by the interaction of the lithography beam 060 with the non-planar initial structure 010. Depending on storage capacity and computing power of the data processing unit 700, the structure data 770 and/or the correction data 790 can either be stored for the entire target structure 030 in the data memory 750 or, alternatively, be stored for partial sections of the target structure 030 in the data memory 750 and be reloaded as necessary by an optional second data processing unit 800.

Figure 4:
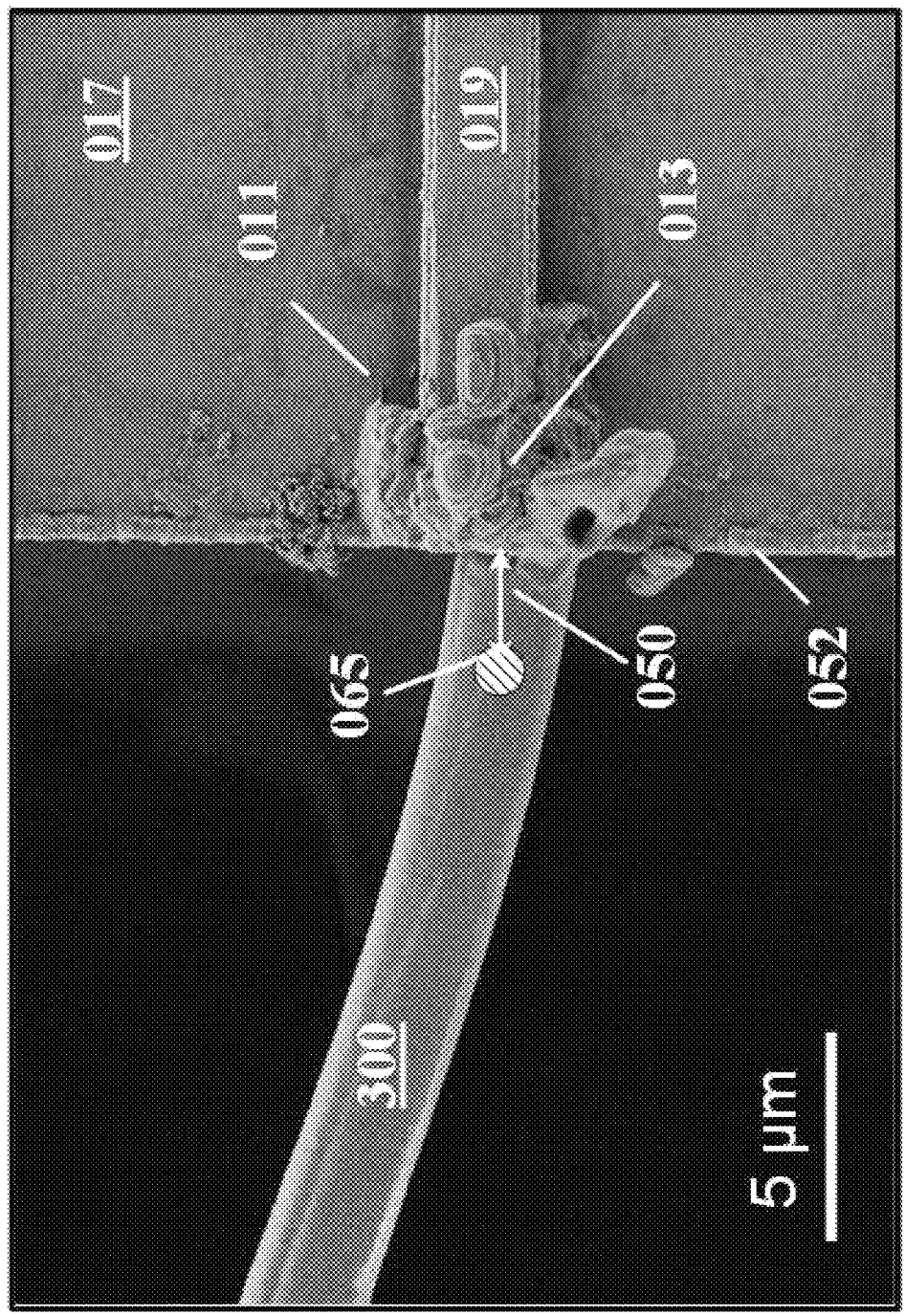
FIGS. 4a-4c show schematic illustrations of one preferred exemplary embodiment of a method according to this disclosure for producing a photonic wire bond which directly adjoins a vertical facet of an integrated optical chip: 4a) schematic illustration of a first configuration of the production method, 4b) scanning electron microscope (SEM) recording of a structure produced according to this disclosure, 4c) schematic illustration of a further configuration of the production method.

FIG. 4 illustrates one preferred method according to this disclosure for producing a photonic wire bond in accordance with U.S. Pat. No. 8,903,205 B2 or U.S. Pat. No. 9,034,222 B2, in which the photonic wire bond can connect directly to a vertical facet of an integrated optical chip. This can occur for example when linking facet emitting lasers or semiconductor amplifiers or silicon-photonic chips with correspondingly prepared coupling locations at the chip edge.

FIG. 4 *a*) shows a schematic illustration of the object associated therewith. The target structure 030 is configured here as a so-called photonic wire bond 300, which is connected to a non-planar initial structure 010 comprising a component holder 015, an optical fiber 016 and an integrated optical chip 017. In this case, the "photonic wire bond" 300 is understood to be a structure which enables a laterally mono- or multimode optical connection between two optical waveguides, in the present exemplary embodiment between a waveguide 019 produced on the integrated optical chip 017 and a waveguide core 018 of the optical fiber 016, which is configured here by way of example as a glass fiber. For this purpose, the photonic wire bond 300 is directly connected to vertical waveguide facets of the optical fiber 016 and of the integrated optical chip 017. For production, use is made of an optical immersion lithography method on the basis of two-photon polymerization, wherein the photoresist simultaneously serves as an immersion liquid. Depending on the position of the focal point 065 of the lithography beam 060, the wide open beam cone of the lithography beam 060 that is associated with the high numerical aperture of the lithography optical unit 160 interacts with the as partial regions 011, 012 of the integrated optical chip 017 or the optical fiber 016. This results in a change in the regions 070, 071 of the lithography beam 060 and thus in a change in the intensity distribution in the respectively exposed volume element 040 of the target structure 030 to be produced.

The optical fiber 016 comprises a material which is transparent at the lithography wavelength and whose refractive index differs from the refractive index of the photoresist 100. It can therefore be assumed that the region 071 of the lithography beam 060 that is illustrated in FIG. 4 a) is impaired by a partial reflection at an interface between the optical fiber 016 and the photoresist 100 and also by a change in the optical phase fronts while the region 070 of the lithography beam 060 that impinges on the integrated optical chip 017, which is non-transparent at the lithography wavelength, is completely shaded by reflection at the interface and/or by absorption in the volume of the partial region 011. This has in particular considerable consequences for those volume elements 040 which are situated near to the facet of the integrated optical chip 017, since there almost half of the incident optical power is shaded by the integrated optical chip 017 and, consequently, the threshold for two-photon polymerization at the focal point 065 of the lithography beam 060 can no longer be attained in many cases. This has the effect that the photonic wire bond 300 can no longer connect directly to the waveguide facet of the integrated optical chip 017, which can result in high insertion losses.

However, the method according to this disclosure allows the changes in the target structure 030 that result from the interaction of the lithography beam 060 with the non-planar initial structure 010 and also undesired optically induced changes in the initial structure 010 to be reduced or completely avoided. FIG. 4 b) shows a scanning electron microscope (SEM) recording of a test structure which was produced by the method according to this disclosure. The non-planar initial structure 010 used for this purpose is constituted such that only the shading of the lithography beam 060 by the integrated optical chip 017 occurs during the lithographic production of the near-facet regions of the photonic wire bond 300. The effects on the intensity distribution at the focal point 065 of the lithography beam 060 were changed according to this disclosure by means of an adaptation of the lithography parameters that is dependent on the position of the volume element 040 to be written. In the present exemplary embodiment, an increase in the optical power of the lithography beam 060 was used, which can be defined to a good approximation as a function of the distance 050—projected into a plane perpendicular to the beam axis—between the focal point 065 and the edge 052 defining the shaded region 070. It is thus possible, even in near-facet regions, for the threshold for two-photon polymerization to be attained and thus for the photonic wire bonds 300 that connect directly to the waveguide facet to be produced in a continuous fashion. However, the increase in the lithography power in proximity to the facet has the effect that the optical power interacting with the metallized surface of the integrated optical chip 017 is increased continuously as the focal point 065 approaches the edge 052. By virtue of reflections and local amplifications of the optical field at the metallized surface, this can result in undesired polymerization reactions and optically induced microexplosions in the photoresist, which can lead to the production of changes 013 in the initial structure in those partial regions of the surface of the integrated optical chip 017 which interact with the lithography beam, or to the total destruction of the target structures 030 in the vicinity of the facet.

FIG. 4 c) shows schematically how the interaction of the lithography beam 060 with the non-planar initial structure 010 can additionally be reduced by the lithography system 090 being supplemented by an additional beam shaping unit 110, by means of which the regions 070, 071, 080 of the lithography beam 060 can be changed. In one preferred exemplary embodiment, the regions 070 of the lithography beam that interact with a non-transparent partial region 011 of the initial structure 010 can thus preferably be completely blocked by the associated partial region 113 of the beam shaping unit 010 being switched to a transmission of zero. The effects illustrated in FIG. 4 b) can thus be completely avoided. A similar procedure can be adopted for the region 071 of the lithography beam 060 that interacts with a transparent partial region 012 of the initial structure 110. Various embodiments are suitable for this purpose.

In a first embodiment, for this purpose, the region 071 of the lithography beam 060 can be completely blocked in order to prevent the occurrence of interference of the light from the region 080 of the lithography beam 060 that is not impaired by the topography 020 of the initial structure 010 with light from the region 071 of the lithography beam 060 which was changed in terms of its phase as a result of the interaction with the transparent partial region 012 of the initial structure 010. Such an interference can have the effect that a formation of secondary maxima of the intensity distribution and thus an uncontrolled deformation of the exposed volume element 040 occur at the focal point 065 of the lithography beam 060 (see FIG. 6 and the associated description).

As an alternative to the complete blocking of the region 071 of the lithography beam 060, in a further embodiment with a suitably configured beam shaping unit 110 it is possible to perform a spatially variable change of the amplitude and/or the phase of the lithography beam 060 which either compensates for the change introduced by the interaction with the transparent region 071 of the lithography beam 060 or, in cooperation with said change, can lead to a desired intensity distribution in the volume element 040 to be exposed. With regard to the region 080 of the lithography beam 060 that is not changed by the topography 020 of the initial structure 010, in one embodiment it is possible to choose a neutral setting of the beam shaping unit 110 which allows passage of light in the partial region 112 without amplitude or phase modulation. In an alternative embodiment, it is possible to generate a spatially variable amplitude and/or phase modulation which can lead to a desired intensity distribution in the volume element 040 to be exposed.

Figure 5:
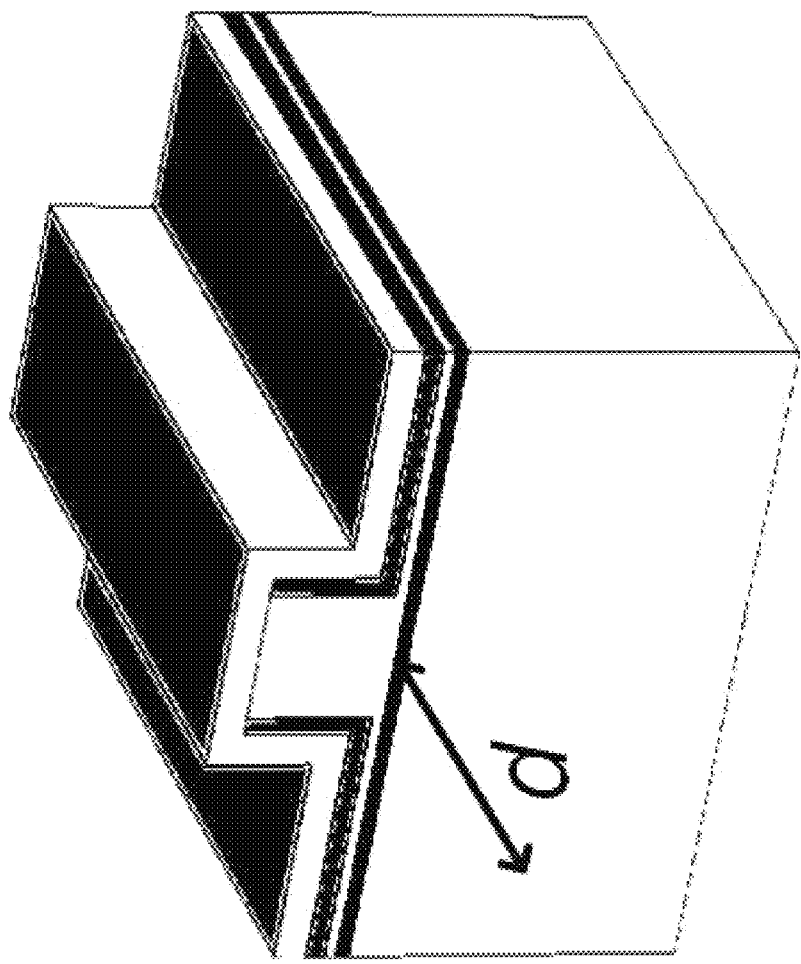
FIGS. 5a-5c show schematic illustrations of a simulation for the effect of a shading edge on a lithography beam: 5a) schematic illustration of a model system, 5b) profile of the intensity of a lithography beam at the focal point, 5c) respective intensity distributions in the vicinity of the focal point as the lithography beam approaches the edge.

FIG. 5 schematically shows a simulation for illustrating an effect of a shading edge 052 on the lithography beam 060.

In this respect, FIG. 5 a) schematically shows a model system comprising a laser chip having an edge emitting laser on the basis of III-V semiconductors InP or InGaAsP. The materials used herein are non-transparent to the light having the lithography wavelength; at the same time, however, the component has on the surface metal contacts that can reflect impinging light. It can thus be assumed that the light interacting with the laser chip does not contribute to the intensity in the vicinity of the focal point 065 of the lithography beam 060.

The illustration in FIG. 5 b) reveals that the shading of the lithography beam 060 leads to a decrease in the maximum intensity observable in the vicinity of the focal point 065 of the lithography beam 060 as the focal point 065 approaches the facet of the laser chip. In this case, the variable d denotes a distance between the focal point 065 of the unimpaired lithography beam 060 and the chip facet causing the shading, while the normalized intensity I plotted on the vertical axis denotes a ratio of the maximum intensity determined for a given distance d in the vicinity of the focal point 065 to the maximum intensity of the undisturbed lithography beam 060, which arises in the limiting case d→∞. The normalized intensity I decreases with decreasing distance d owing to the shading and the resultant deformation of the intensity distribution. The simulations were carried out for an exemplary embodiment in which the focal point 065 of the unimpaired lithography beam 060 is situated at the level of the active zone of the laser chip, that is to say 2.6 μm below the edge 052 defining the shaded region 071 of the lithography beam 060.

FIG. 5 c) demonstrates that approaching an edge 052 that shades the lithography beam 060 results not only in a decrease in the maximum intensity but also in a deformation of the intensity distribution in the vicinity of the focal point 065, as shown by the intensity distribution of the points 1, 2 and 3 identified in FIG. 5 b). The illustrations of the intensity show normalized values related to the maximum that respectively occurs in the cross-sectional area. The origin (0,0) of the coordinate system denotes the focal point 065 that results for the undisturbed lithography beam 060 propagating completely in the photoresist 100 used as an immersion liquid. In the case of large distances (see point 3) the lithography beam 060 is not influenced, thus resulting in an undisturbed distribution that is symmetrical with respect to the plane x=0. With smaller distances, a tilting and an associated asymmetry of the intensity distribution in the vicinity of the focal point 065 (see points 1 and 2) additionally occur besides the intensity decrease illustrated in FIG. 5 b). The tilting can lead to a deformation of the volume element 040 produced, which deformation can preferably be taken into account in an exposure step. In addition, a shift—hardly noticeable in FIG. 5 b)—in the point of maximum intensity from the fictitious focal point of the undisturbed lithography beam 060 can occur, which can preferably be compensated for by a correction of the positioning of the lithography beam 060.

Figure 6:
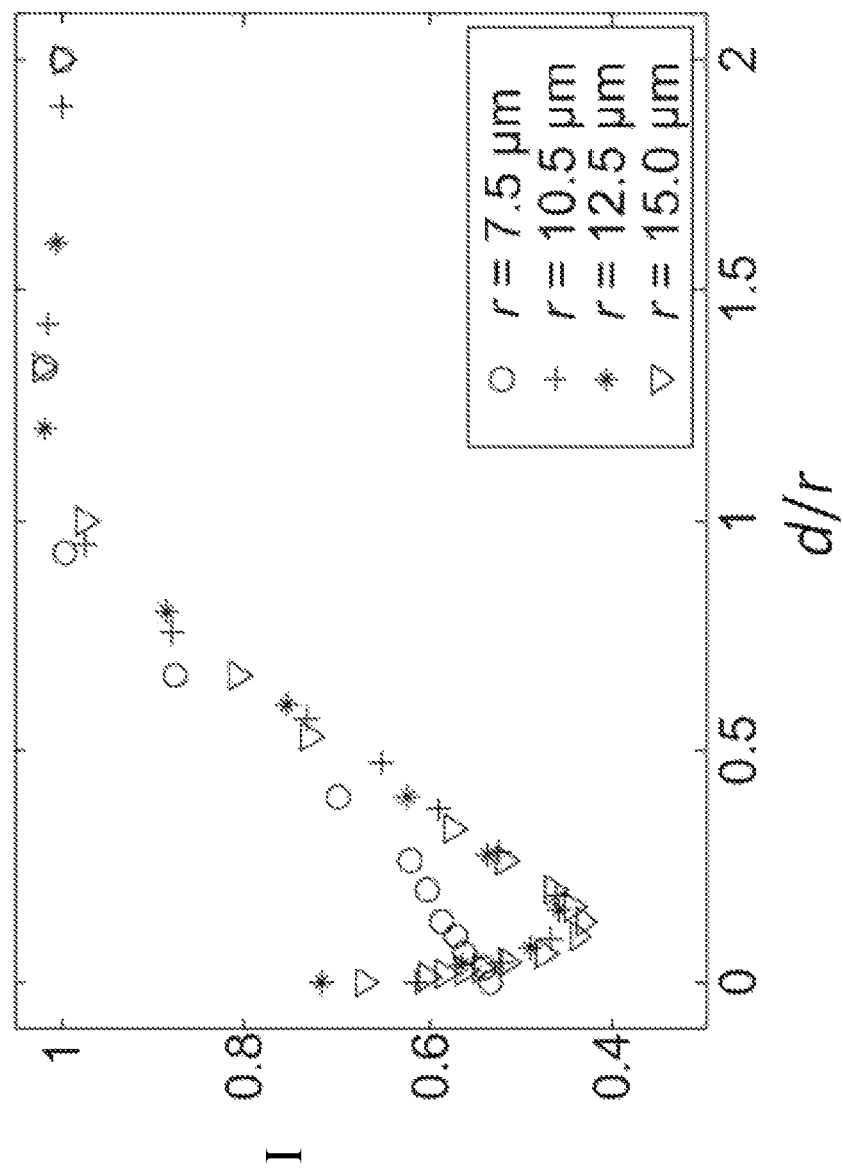
FIGS. 6a-6i show a further exemplary embodiment with a schematic illustration of the production of a target structure in the vicinity of the facet of a light-guiding optical fiber: 6a) profile of the intensity of a lithography beam as a function of the distance from the fiber facet, 6b) profile of the displacement of the point of maximum intensity as a function of the distance between the nominal focal point and the fiber facet, 6c) profile of the intensity of a lithography beam at the focal point, 6d) electron microscope recording of a waveguide taper at the end face of a monomode fiber, 6e)-6g) electron microscope recordings of photonic wire bonds, 6h) schematic illustration of the method for producing the target structure in the vicinity of the fiber facet, 6i) schematic illustration of a fiber.
Figure 6:
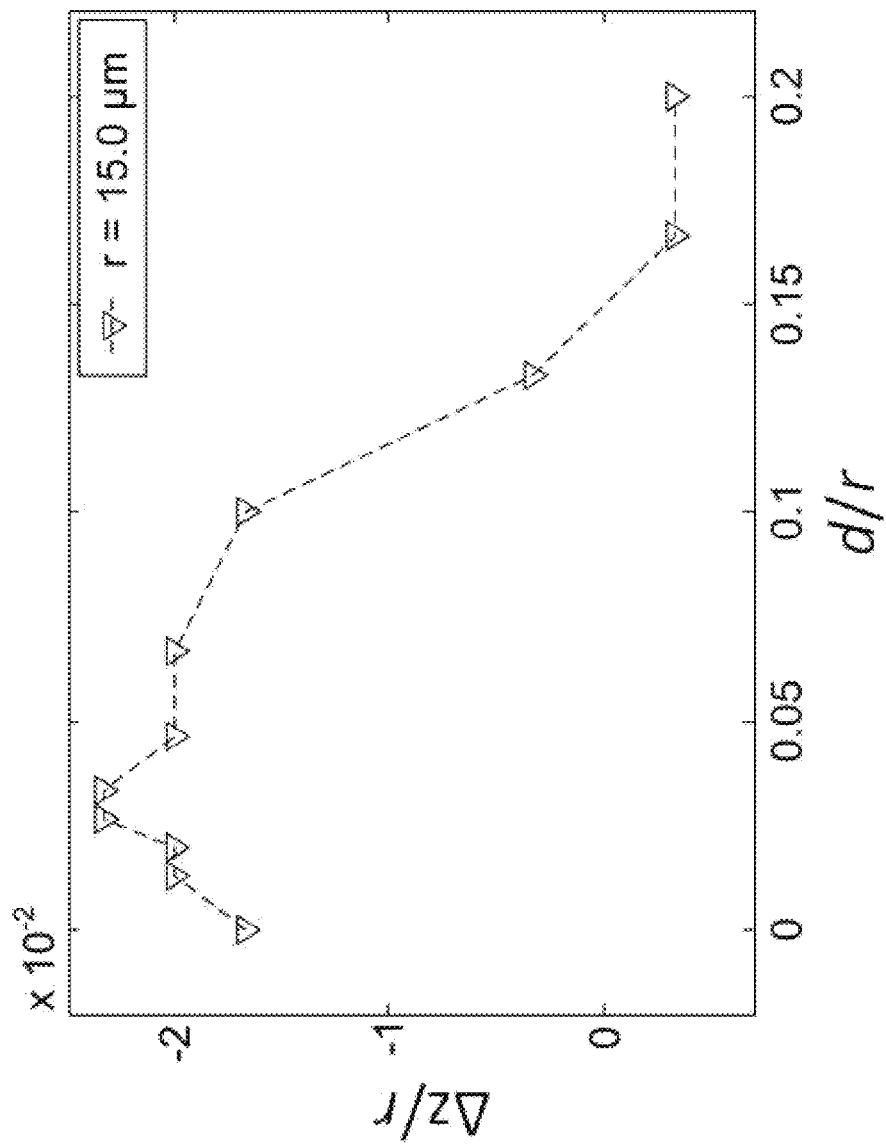
Figure 6:
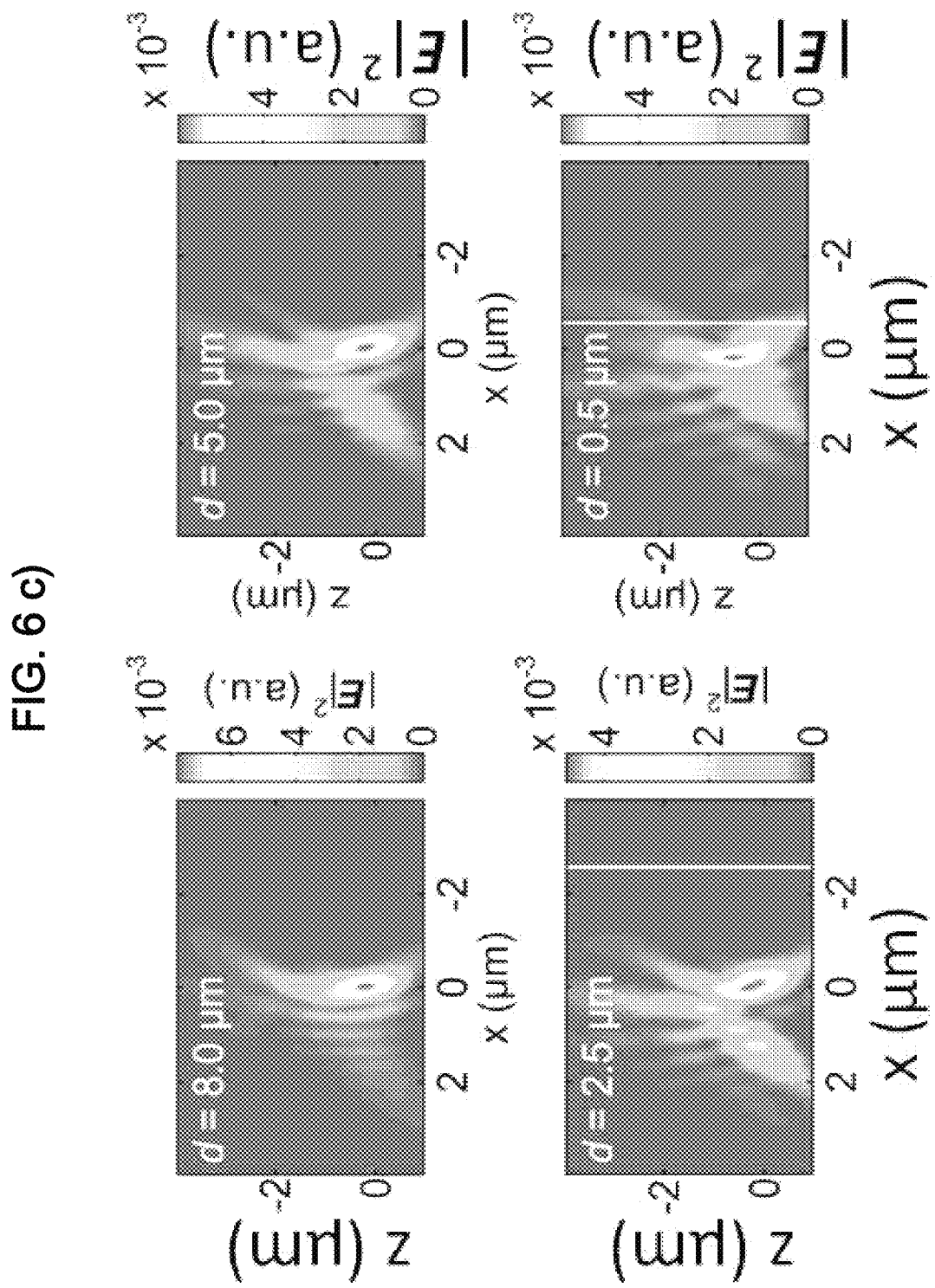
Figure 6:
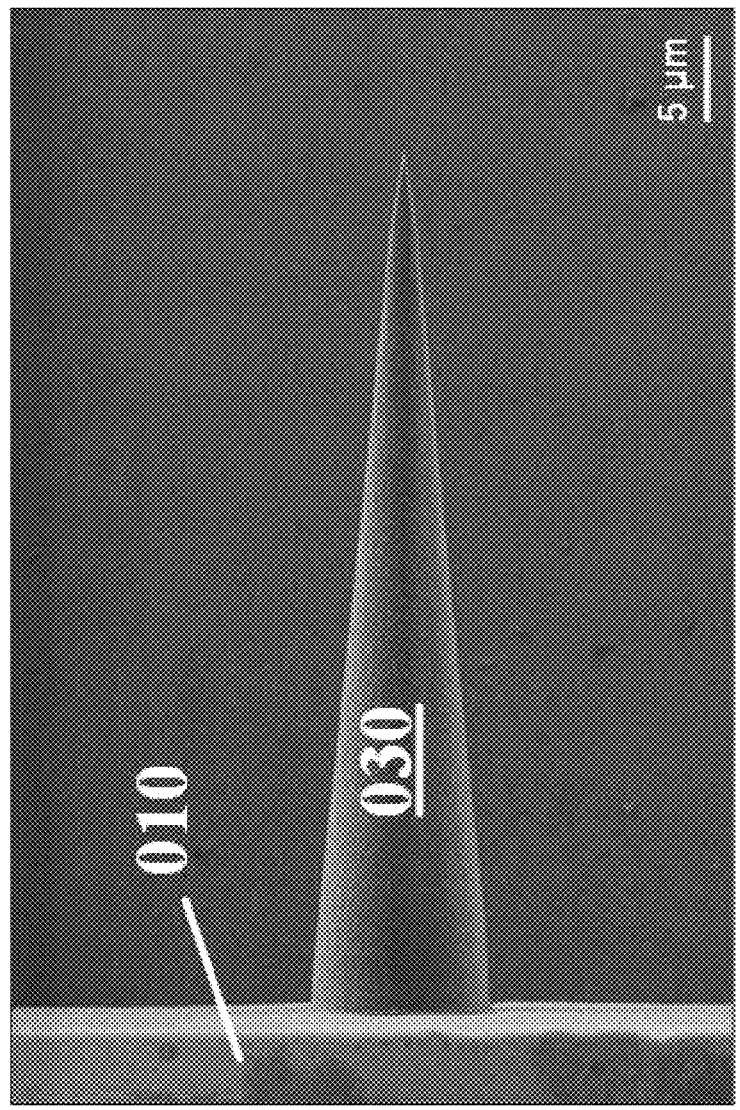
Figure 6:
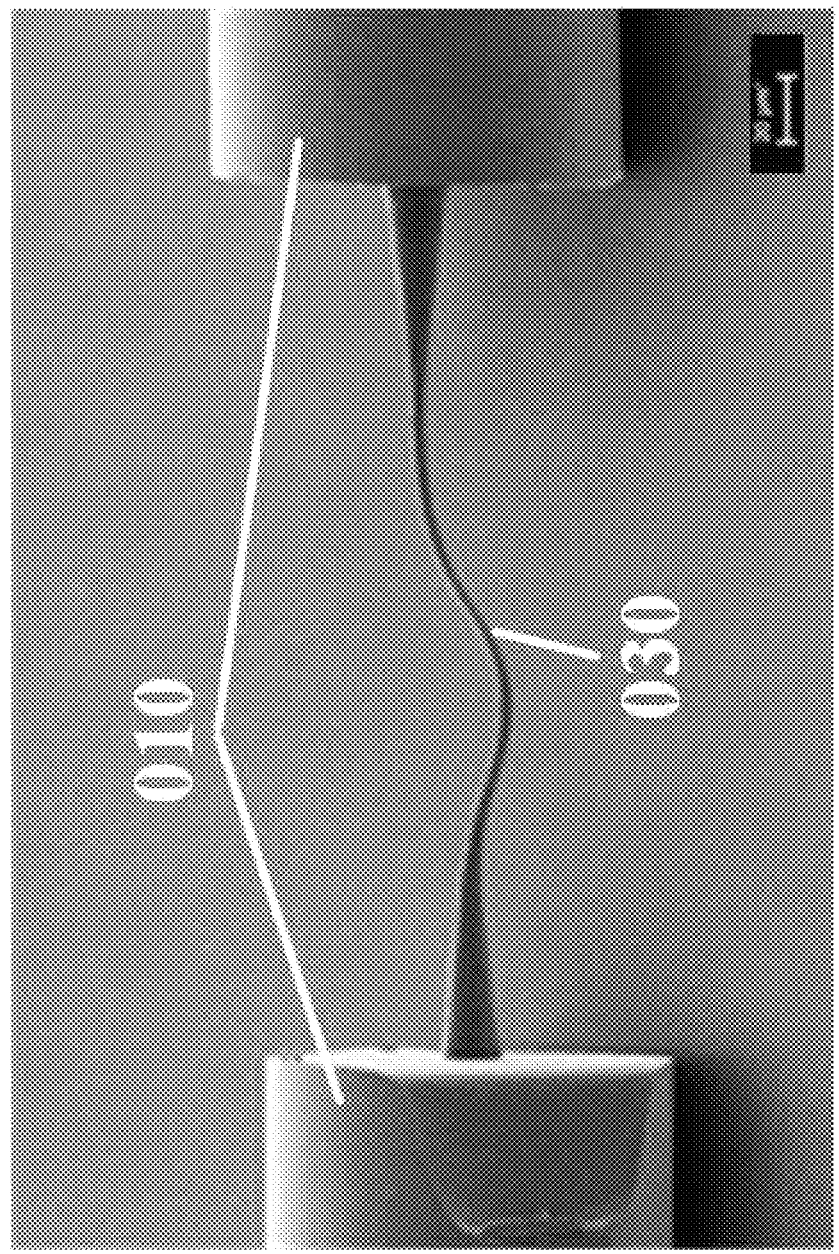
Figure 6:
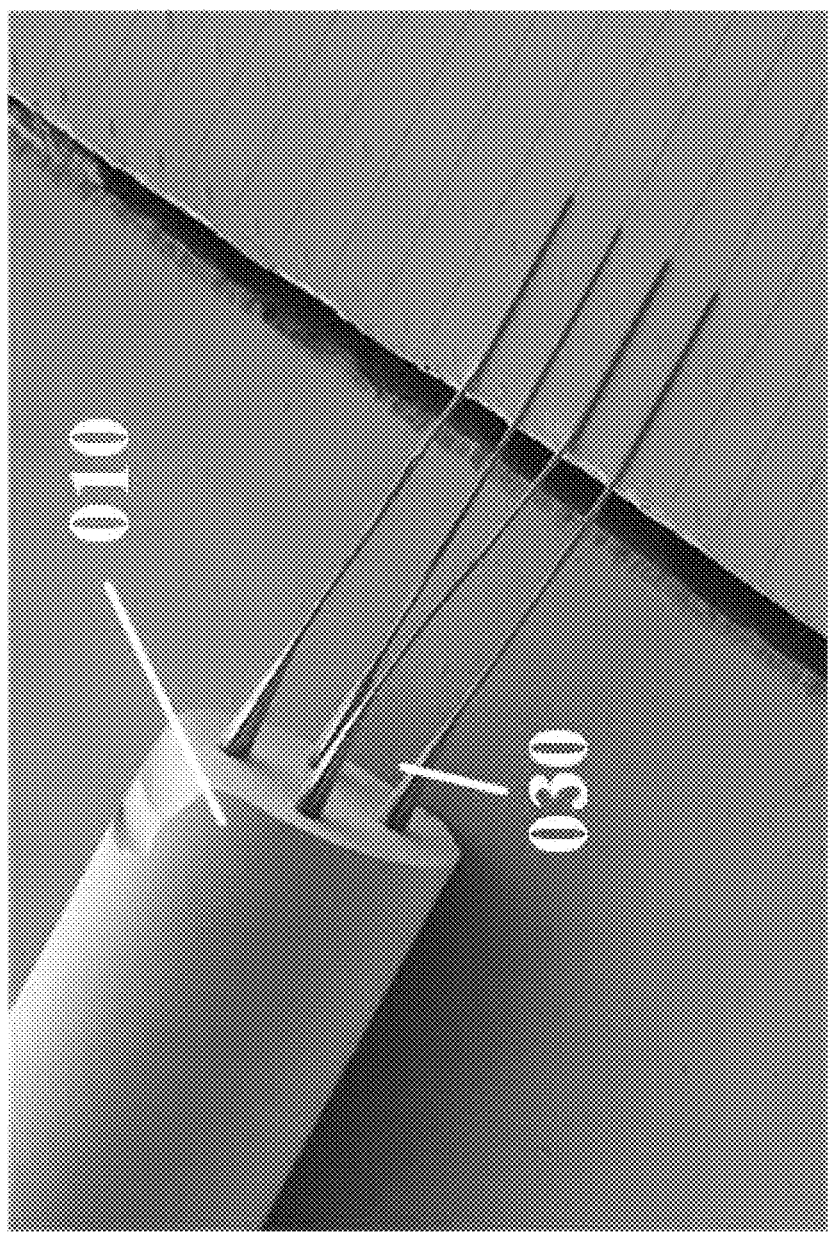
Figure 6:
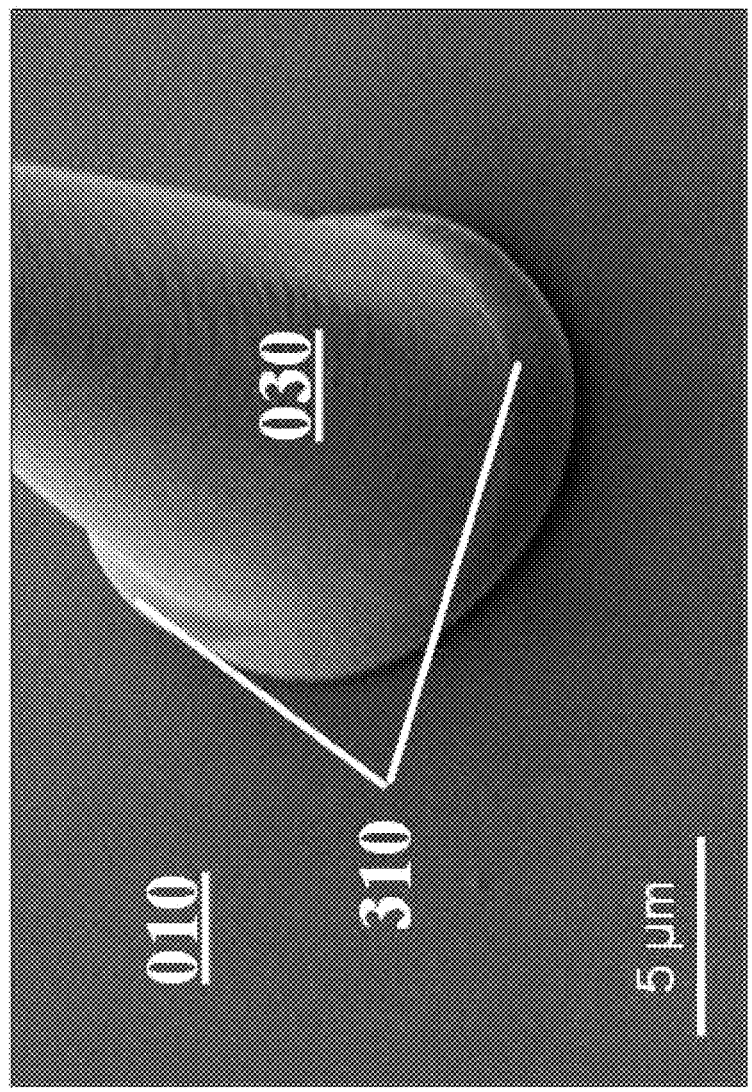

FIG. 6 shows a further exemplary embodiment relating to producing the target structure 030 in the vicinity of a fiber facet. In contrast to the linking of the photonic wire bonds 300 to vertical facets of semiconductor-based integrated optical chips 017 as illustrated in FIGS. 4 and 5, in the case of coupling to optical fibers or vertical facets of glass-based chips, complete shading of the region 071 of the lithography beam 060 that interacts with the non-planar initial structure 010 does not occur, since the associated partial region 012 of the non-planar initial structure 010 comprises a material that is transparent at the lithography wavelength. However, the transparent material has a different value for the refractive index than the photoresist 100 normally used as an immersion liquid, which leads to a change in the phase fronts in the region 071 of the lithography beam 060 and thus to a deformation of the intensity distribution in the vicinity of the focal point 065 of the lithography beam 060.

FIGS. 6 a), b), c) and h) illustrate exemplary simulations for producing a target structure in the vicinity of a fiber facet. In accordance with FIG. 6 h), the non-planar initial structure 010 in this exemplary embodiment comprises a glass fiber embedded into the photoresist 100 serving as an immersion liquid. In order to analyze the influence of the glass fiber, for the latter by virtue of optically homogenous cylindrical bodies 010 for the cladding a refractive index of 1.4537 at a lithography wavelength of 780 nm is assumed. In the present exemplary embodiment, the dimensions of the glass fiber were actually reduced in order to reduce simulation times and memory demand. However, this exemplary embodiment already allows the qualitative analysis of the essential effects; only the quantitative parameters change upon transition to a real glass fiber. The focal point 065 of the lithography beam 060 having a numerical aperture of 1.3 is guided along the longitudinal axis of the cylinder to the end face thereof, such that a region 071 of the lithography beam 060 interacts with the cylinder. The effects of the intensity distribution in the vicinity of the focal point 065 of the lithography beam 060 are dependent on the distance d from the end face of the cylinder and on the radius r of the cylinder.

FIG. 6 a) shows the maximum intensity determined for a specific optical power in the lithography beam 060 by simulation, said maximum intensity being proportional to the squared amplitude of the electric field $|E|^2$ as a function of the distance d normalized to the fiber radius r, wherein the intensity values were normalized to the maximum value occurring far away from the fiber facet (d/r=2). In order to reduce the computation times of the finite difference time domain (FDTD) algorithm used therefor, only small fiber radii of up to 15 μm were analyzed. For very small fiber radii (r=7.5 μm), this results in a continuous decrease in the normalized intensity upon approaching the facet, while the normalized intensity for larger fiber radii (r≥10.5 μm) attains a minimum of approximately 0.43 at a distance of d/r=0.13.

FIG. 6 c) provides an explanation for this observation. A superimposition of light from the region 080 of the lithography beam 060 that is not impaired by the topography 020 of the initial structure 010 with light from the region 071 of the lithography beam 060 that is changed in terms of phase owing to the interaction with the non-planar initial structure 010 leads to interference and thus to secondary maxima of the intensity distribution in the vicinity of the focal point 065 of the lithography beam 060. The secondary maxima approach the primary maximum for decreasing distances d from the fiber facet and finally merge with the primary maximum for d→0, which leads to an increase in the intensity. Similar effects can also occur for practically relevant diameters of conventional monomode fibers (r=62.5 μm).

The decrease in the peak intensity in the beam cross section upon approaching the end face of a glass fiber can be compensated for according to this disclosure by means of at least one correction parameter, in particular by means of an adaptation of the optical power in the lithography beam 060. This type of compensation was used to produce the target structure 030 tapering conically from left to right, as illustrated in FIG. 6 d), in the form of a waveguide taper that connects directly to the end facet of a standard monomode fiber. In this exemplary embodiment, the optical power P in the lithography beam was increased as the focal point 065 approached the fiber facet in accordance with a piecewise linear function approximately reflecting the reciprocal values of the normalized intensity I determined by the simulation in accordance with FIG. 6 a) for large fiber radii. Similar methods were also used to produce the photonic wire bonds attached to glass fiber facets in FIGS. 6 e) and f), in order to create optical transitions having the least possible losses between the waveguide core of the glass fiber (mode field diameter approximately 10 µm) and the photonic wire bond (mode field diameter<5 µm).

Besides a change in the maximum intensity occurring in the vicinity of the focal point 065 of the lithography beam 060, the interaction with the non-planar initial structure 010 can also effect a spatial shift in the point of maximal intensity. In this regard, by way of example, the approach of the focal point 065 of the lithography beam 060 having a high numerical aperture to the end facet of a glass fiber embedded into the photoresist 110 (n=1.52) (cladding of the glass fiber: $n_1$=1.4537 and core of the glass fiber $n_0 \approx$1.4589) has the effect that the point of maximal intensity moves slightly toward the lithography lens. This is evident from FIG. 6 c). For a distance of d=0.5 µm, the point of maximal intensity shifts from z=0 to negative values of z, which corresponds to a movement in the direction of the lithography lens. In this case, the coordinate system was chosen such that z=0 corresponds to the nominal position of the focal point 065 if the lithography beam 060 can propagate without disturbance in the photoresist 100 serving as an immersion liquid.

FIG. 6 b) shows a quantitative analysis of the shift $\Delta z$ in the point of maximum intensity as a function of the distance between the nominal focal point 065 and the facet. The simulation was carried out on the basis of a simple cylindrical model body having a radius of r=15 µm composed of quartz glass. This model resulted in a shift $\Delta z$ of 1.5 µm in the direction of the lithography lens for a lateral distance of 1.7 µm between the nominal focal point 065 and the facet. As evident from FIG. 6 g), this leads to deviations 310 in the geometry of the target structure 030 produced, which are able to be reduced or avoided according to this disclosure by means of a correction of the positioning of the lithography beam 060.

As illustrated by way of example in FIG. 6 h), as an alternative or in addition to the adaptation of the power and the position of the lithography beam 060 by means of a beam shaping unit 110 it is possible to achieve an adaptation of the beam profile to the changes in the lithography beam 060 that are caused by the non-planar initial structure 010. The settings of the beam shaping unit are determined on the basis of the known topography 020 of the non-planar initial structure 010. For a given volume element 040 to be exposed, in this case firstly the regions 071 and 080 of the lithography beam 060 are determined, which interact and respectively do not interact with the non-planar initial structure 010.

In accordance with FIGS. 6 h) and i), this can preferably be achieved by means of a projection of the topography 020 of the non-planar initial structure 010 that proceeds from the midpoint 041 of the volume element 040. In one particular embodiment, for this purpose the region 071 of the lithography beam 060 that interacts with the non-planar initial structure 010 is blocked by means of a corresponding setting of the associated partial region 111 of the beam shaping unit 110. By contrast, for the region 080 of the lithography beam 060 that does not interact with the non-planar initial structure 010, a setting of the associated partial region 112 of the beam shaping unit 110 is determined which leads to an intensity distribution that is as concentrated as possible spatially and has the highest possible peak intensity and smallest possible extent in all three spatial directions. In this context, by way of example, the sum of the second order central moments of the intensity distribution can be used as a quality criterion to be minimized numerically. The setting of the beam shaping unit 110 can be determined either separately for each volume element 040 or, alternatively, for a group of volume elements 040; in the latter case, in order to determined the region 080 of the lithography beam 060, it is preferably ensured that the region 080 of the lithography beam 060 interacts with the non-planar initial structure 010 for no volume element 040 from the chosen group.

Figure 7A:
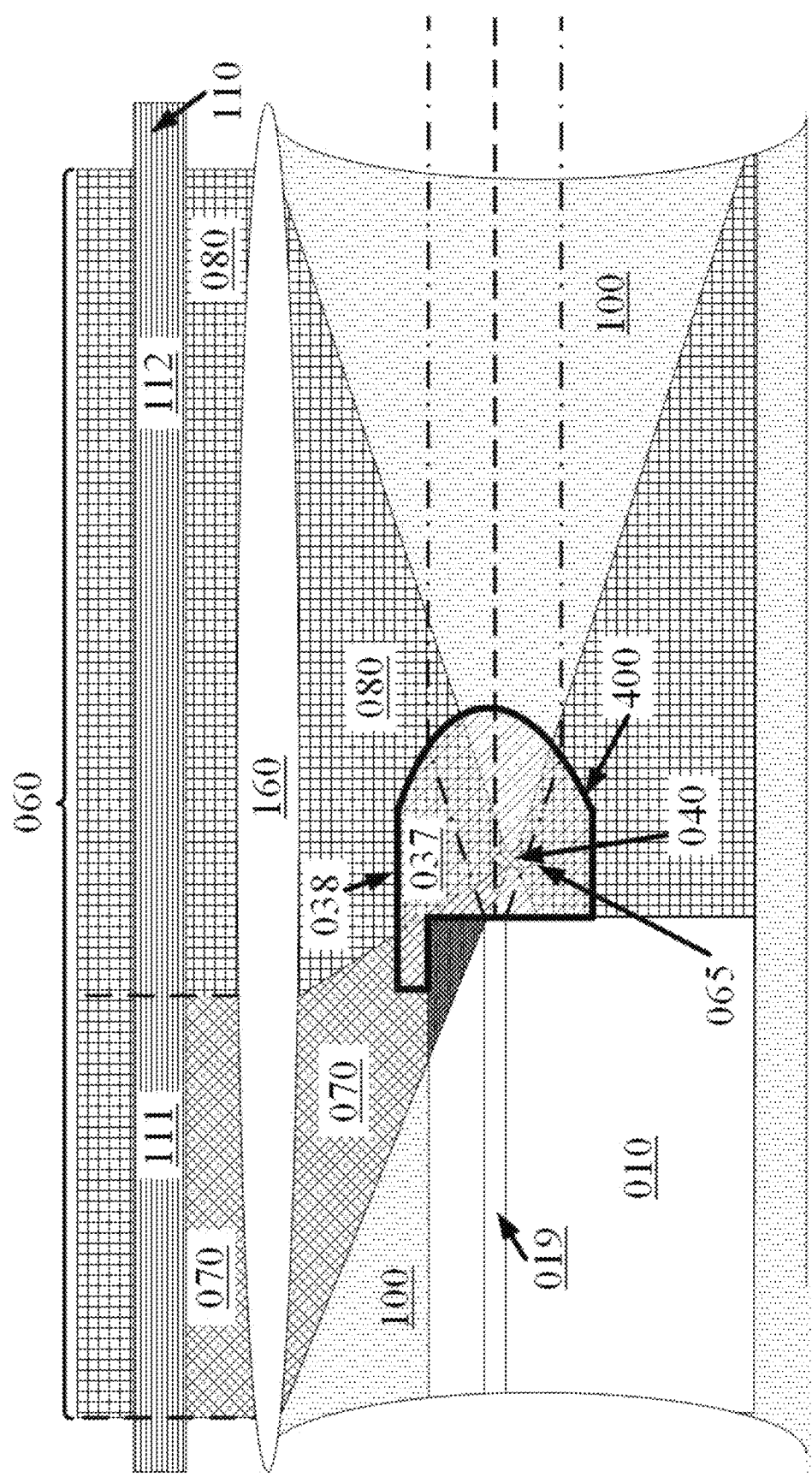
FIGS. 7a-7c show a further exemplary embodiment for lithographically producing micro-optical lens elements on non-planar initial structures, such as, e.g., facet emitting integrated optical chips: 7a) schematic illustration of the method for producing the micro-optical lens elements, 7b) and 7c) electron microscope recordings of micro-optical lens elements produced in accordance with this disclosure.
Figure 7:
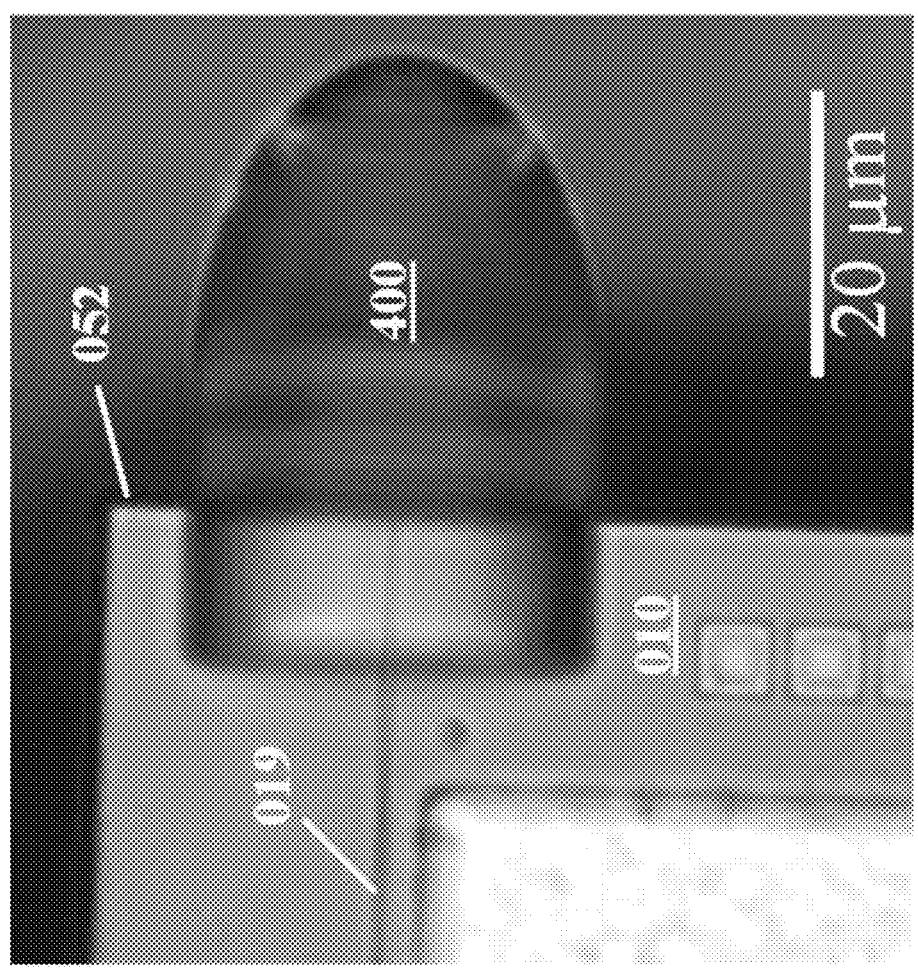
Figure 7C:
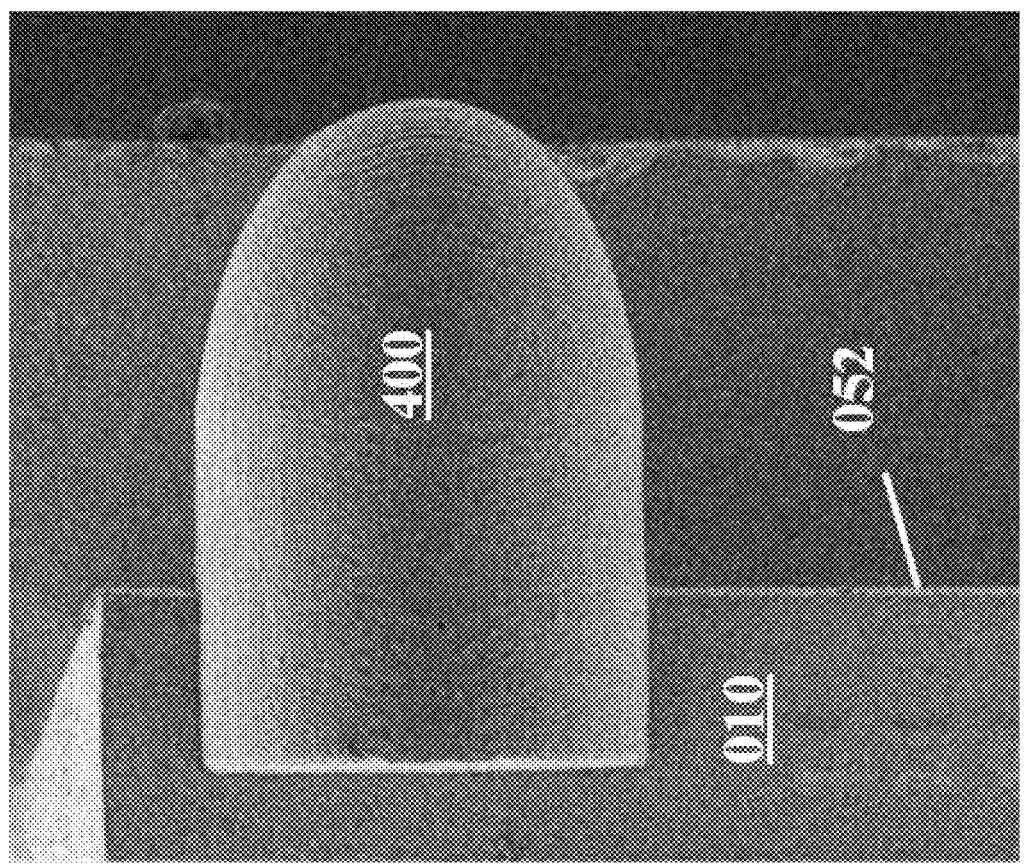

FIG. 7 illustrates a further exemplary embodiment of the present method for lithographically producing micro-optical lens elements 400 on non-planar initial structures such as, e.g., facet emitting integrated optical chips.

FIG. 7 a) schematically shows the production of near-facet volume elements 040, wherein a region 070 of the lithography beam 060 interacts with the initial structure 010 in the form of an integrated optical chip, on whose facet the micro-optical lens element 400 is produced, in such a way that an adaptation of the lithography parameters in accordance with this disclosure is advantageous. In a first exemplary embodiment, the decrease in the peak intensity occurring in the vicinity of the focal point 65, said decrease being effected by the interaction with the chip, can be at least approximately compensated for by an increase in the lithography power, wherein the micro-optical lens elements 400 illustrated in FIGS. 7 b) and c) were obtained. In order to avoid changes in the intensity distribution as a result of interference with the region 070 of the lithography beam 060 that is changed by the non-planar initial structure, it is possible for the lithography beam 060 to be blocked by means of a corresponding setting of the partial region 111 of the beam shaping unit 110. Alternatively or additionally, the region 112 of the beam shaping unit that is assigned to the unchanged region 080 of the lithography beam 060 can be set so as to result preferably in an intensity distribution that is as concentrated as possible spatially and has the highest possible peak intensity and the smallest possible extent in all three spatial directions. The setting of the beam shaping unit 110 can be determined either separately for each volume element 040 or, alternatively, for a group of volume elements 040. Given accurate knowledge of the changes in the region 080 of the lithography beam 060 that are introduced by the non-planar initial structure 010, said changes can also be compensated for by means of a corresponding setting of the partial region 111 of the beam shaping unit 110.

Figure 8:
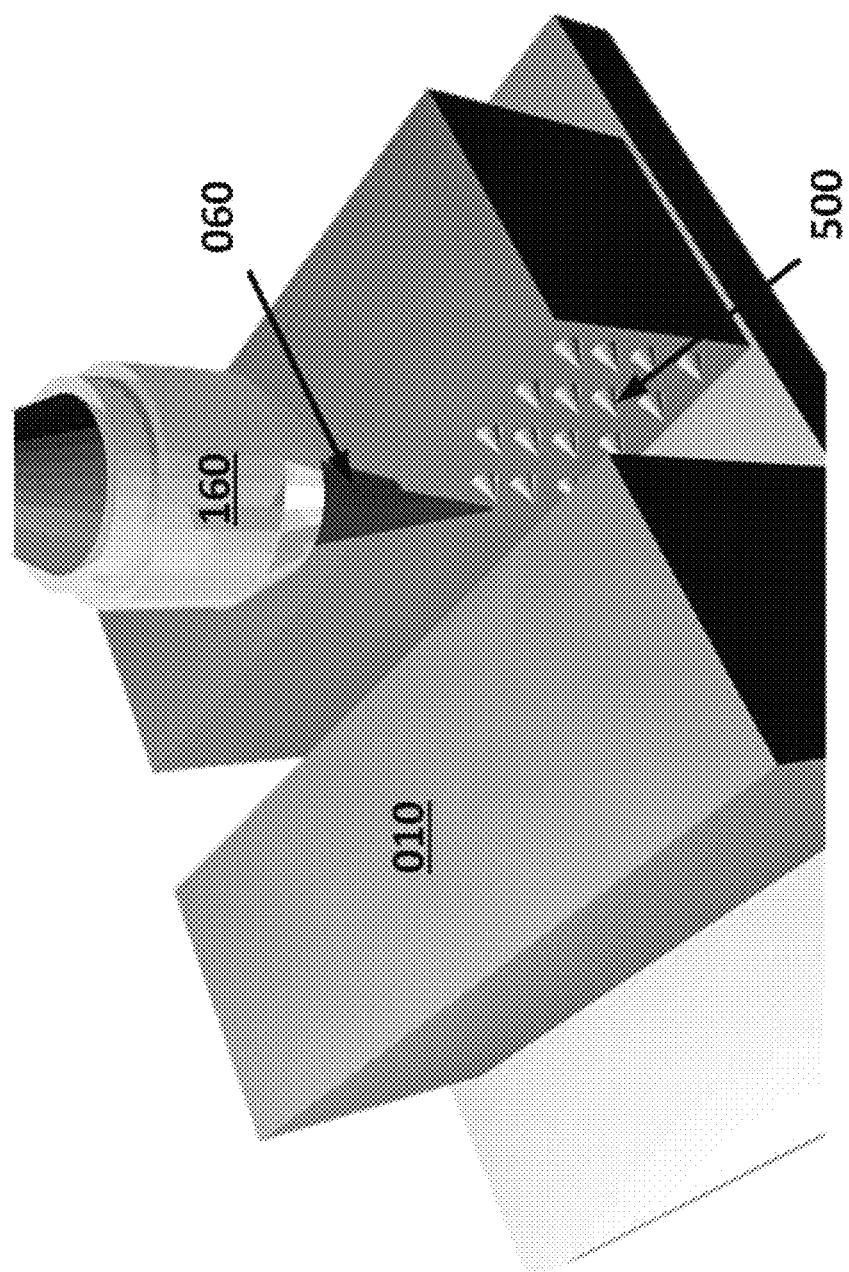
FIG. 8 shows a further exemplary embodiment for lithographically producing microstructures on a non-planar microfluidic initial structure.

FIG. 8 schematically shows the production of target structures 030 in the form of microstructures 500 on non-planar microfluidic initial structures 010. In this case, the microstructures 500 are produced on the sidewalls of a three-dimensional microfluidic structure by means of two-photon lithography. This results in a partial change in the lithography beam 060, the effects of which can be wholly or partly compensated for by means of the measures described in the other exemplary embodiments.

FIG. 9 a) schematically shows the illustration of a further exemplary embodiment in which a target structure 030 that has already been produced interacts with a region 070 of the lithography beam 060 during the exposure of a subsequent further target structure 031. The target structure 030 that has already been written can thus be regarded as a non-planar initial structure 010 for a subsequent exposure step for producing the further target structure 031. In many cases, such a constellation may be able to be avoided at least partly by the choice of a sequence of the exposure steps, which is not possible in the present exemplary embodiment on account of the size of the target structures 030. Each of the target structures 030, 031 here fills a dedicated write field of the lithography system and is therefore preferably produced in a single work operation, in particular since changing between different write fields is disadvantageous.

FIG. 9 b) shows an electron microscope recording of target structures 030, 031 produced by direct writing lithography without application of the correction parameters according to this disclosure. In this example, the edge 052 of the target structure 030 that has already been produced changes the lithography beam 060 during the subsequent production of the further target structure 031 such that the target structure 031 to the left of the structure 030 already produced is not correctly exposed in a partial region 053. With the beam shaping unit 110 illustrated in FIG. 9 a), according to this disclosure the unchanged region 080 of the lithography beam 060 can be correspondingly adapted in order also to correctly expose the further target structure 031 in the partial region 053.

Figure 10:
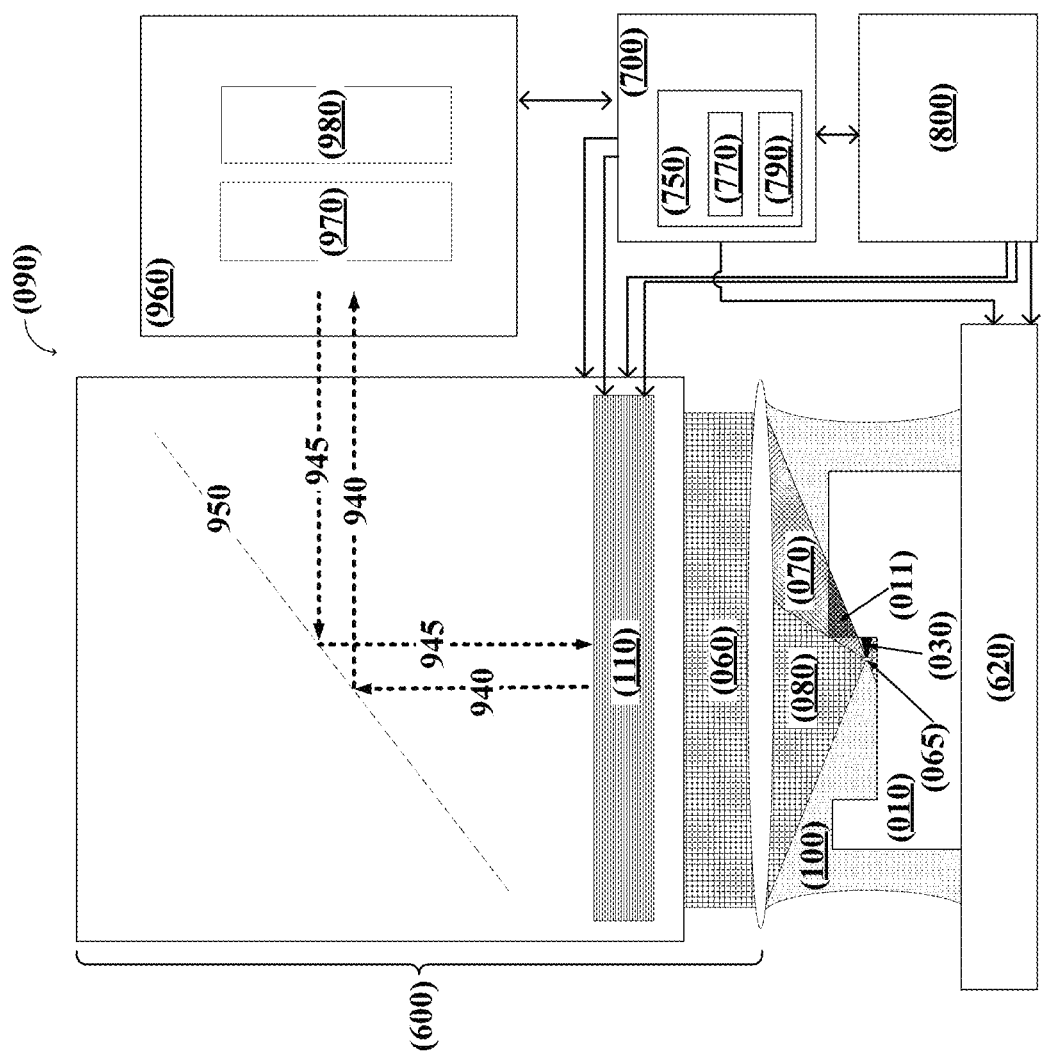
FIG. 10 shows a schematic illustration of one exemplary embodiment of a device (lithography system) according to this disclosure for lithographically producing a target structure on a non-planar initial structure, which contains a luminescence detection unit configured for detecting luminescence radiation from a vicinity of a focal point of a test beam.
Figure 11A:
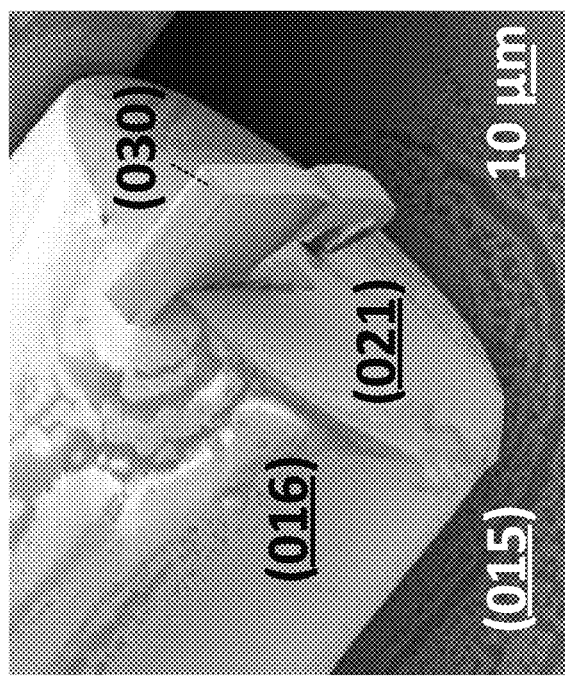
FIGS. 11(a)-11(d) show an exemplary embodiment and comparative example in which the interaction of the lithography beam with a non-planar initial structure can be detected by detecting the luminescence radiation from a vicinity of the focal point of a test beam: 11(a) detected luminescence power in a vicinity of a fiber facet without correction of the power of the exciting test beam; 11(b) result of lithographically fabricating a test structure without correction of the power of the lithography beam; 11(c) detected luminescence power in a vicinity of a fiber facet with a correction of the power of the exciting test beam; 11(d) result of lithographically fabricating a test structure with correction of the power of the lithography beam.
Figure 11B:
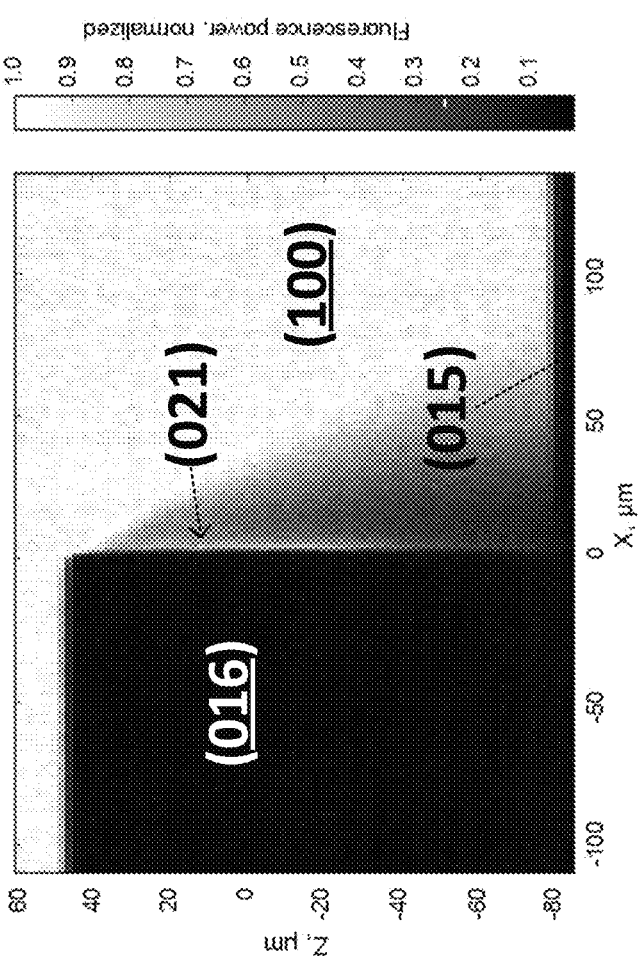
Figure 11C:
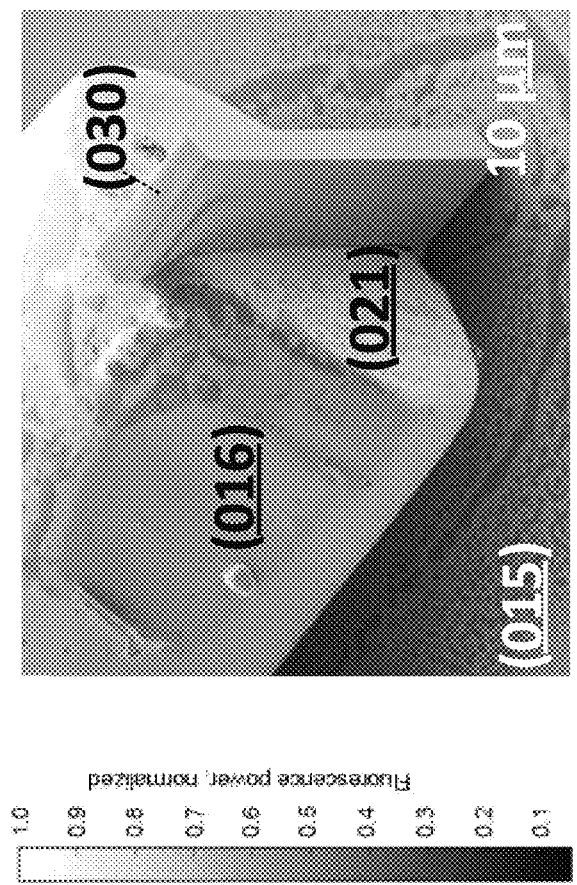
Figure 11D:
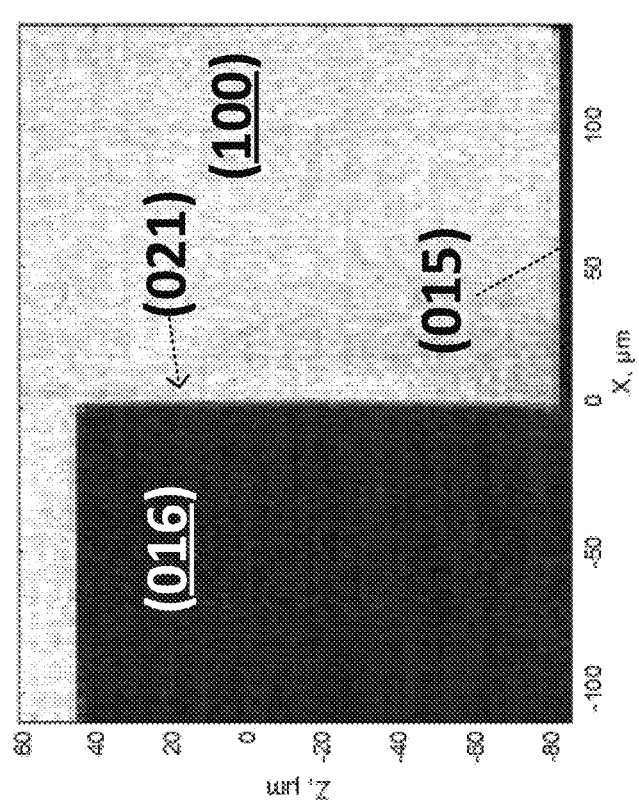

FIG. 10 shows a schematic illustration of one exemplary embodiment of a device 090 according to this disclosure for lithographically producing a target structure 030 on a non-planar initial structure 010, wherein the device also contains, in addition to the components described in association with FIG. 3, a luminescence detection unit 960, which is configured for detecting luminescence radiation 940 from a vicinity of the focal point of a test beam and which is controlled by the data processing unit 700. In one simple embodiment, the test beam can be generated by the same light source and beam shaping unit that are also used for lithographically patterning the target structure 030 in the photoresist 100 simultaneously serving as an immersion medium. For this purpose, a beam splitter 950, which is depicted schematically as a partly transmissive mirror in FIG. 10, can be introduced into the beam path of the lithography system, which beam splitter can at least partly detect the luminescence radiation 940 generated in the vicinity of the focal point of the test beam and feed it to the luminescence detection unit 960. The beam splitter 950 can be situated at an arbitrary position in the beam path and need not necessarily be installed upstream of the beam shaping unit 110 as depicted schematically in FIG. 10. Furthermore, the beam splitter need not necessarily be designed as a partly transmissive mirror. Alternative implementations can comprise fiber-based or integrated optical power dividers, which either are optically broadband or can have a dichroic characteristic, optical circulators or else diffraction gratings. Furthermore, the luminescence detection unit 960 can also be designed such that a beam path for detecting the luminescence radiation 940 can be completely separated spatially from the path of the test beam and/or of the lithography beam, and that a power divider is therefore not necessary. The luminescence detection unit 960 can comprise, as in the present exemplary embodiment, a photodetector 980 and also an optional optical filter 970. The optional optical filter 970 can preferably be designed as a color filter which can allow passage of the luminescence radiation 940 originating from the vicinity of the focal point of the test beam, while backscattered light of the test beam itself is suppressed. In order to enable a reliable result even at low luminescence powers, the photodetector 980 can be designed as a photomultiplier (PM). In addition to the components mentioned, the luminescence detection unit 960 can comprise further components, such as, e.g., optical fibers, diaphragms, lens elements or other optical, optoelectronic or optomechanical components, diffraction gratings, spectrometer modules or cameras. In one particular embodiment, these components can make it possible to achieve a spatially selective detection of the luminescence power, in particular according to the principle of confocal microscopy. As an alternative or in addition thereto, a use of diffraction gratings or spectrometer modules can make it possible to spectrally analyze the luminescence radiation 940. Cameras can allow a spatial distribution of the luminescence power to be detected. These components need not be used exclusively for detecting the luminescence radiation, but rather can simultaneously perform further functions within the lithography system. In one particular embodiment, the luminescence radiation 940 can preferably be detected by way of a camera which is present anyway in the lithography system and which can additionally serve for detecting the position of the non-planar initial structure 010 in the coordinate system of the lithography system. Therefore, the luminescence detection unit 960 also need not always be present as a physically delimited assembly, but rather can comprise at least in part components which are installed additionally or anyway in the lithography system and which are configured in their entirety such that they allow the detection of the luminescence radiation 940 originating from the interaction of a test beam with the photoresist 110 or with a test medium. Alternatively or additionally, the luminescence detection unit 960 can also serve for generating a test beam 945 that can be used to excite luminescence radiation 940 in the photoresist 110 or in the test medium. Here, too, the luminescence detection unit 960 need not necessarily be present as a physically delimited assembly, but rather can comprise components which are installed in addition or anyway in the lithography system.

FIG. 11 shows an exemplary embodiment and comparative example in which the interaction of the lithography beam 060 with the non-planar initial structure 010 can be detected by the detection of luminescence radiation 940 from a vicinity of the focal point of a test beam and can thus be used for the location-dependent correction of the lithography power. As shown in FIGS. 11(b) and 11(d), the arrangement can comprise a non-planar initial structure which can comprise an optical fiber 016 secured on a component holder 015, on the facet 021 of which optical fiber a target structure 030 in the form of a parallelepipedal body extending vertically over the entire facet 021 is intended to be fabricated. In the case of this arrangement, in accordance with the simulation results corresponding to FIG. 6a it may be expected that a disturbance of the beam profile and thus a decrease in the intensity at the focal point 065 of the lithography beam 060 occur owing to the interaction of the lithography beam 060 with the optical fiber 016. In this case, it may be expected that said interaction and a resultant decrease in the intensity at the focal point 065 prove to be all the greater, the nearer the focal point 065 of the lithography beam 060 is to the fiber facet 021 and to the component holder 015. By contrast, in accordance with FIG. 6a, an increase in the intensity should be expected very near to the fiber facet. According to this disclosure, these effects can be directly detected metrologically by the method of luminescence detection. For this purpose, firstly the spatial region situated upstream of the fiber facet 021 can be scanned using a test beam and the luminescence radiation generated in a vicinity of the focal point of a test beam 945 can be detected metrologically. For this purpose, the lithography system is preferably supplemented by a luminescence detection unit 960. In one particular embodiment, said luminescence detection unit can comprise an arrangement which is based on the principle of confocal microscopy and by means of which luminescence radiation 940 from a vicinity of the focal point of the test beam can be detected spatially selectively. In addition, an optical short-pass filter 970 can be used, by means of which the exciting radiation of the test beam and the luminescence radiation 940 can be spectrally separated from one another. The lithography beam 060 itself can be used as test beam, wherein the power can be chosen such that the luminescence radiation 940 is visible, but a crosslinking reaction still does not occur in the photoresist 110. For the photoresist 110, in the present exemplary embodiment, use was made of a commercially available acrylate suitable for application in multi-photon lithography, and a photoinitiator comprising a fluorene group that is highly fluorescent under UV excitation was admixed with said acrylate. The test beam can preferably comprise a sequence of short laser pulses having a pulse duration of 50 fs to 250 fs, preferably of approximately 100 fs, a repetition rate of 50 MHz to 250 MHz, preferably of approximately 100 MHz, and a center wavelength of 750 nm to 800 nm, preferably of approximately 780 nm. Other types of test beams are possible, however. The excitation of the emission of fluorescence radiation by the fluorene group of the photoinitiator just like the initiation of the crosslinking reaction in the photoresist may be possible only by means of multi-photon processes, which allows the expectation of a strong correlation between the fluorescence signal obtained during the test exposure and the degree of crosslinking of the photoresist 110 that should be expected in the lithography process. The fluorescence radiation emitted in the vicinity of the focal point of the test beam had a wide optical spectrum which extends from approximately 460 nm to 540 nm and which can thus easily be separated from the backscattered optical power of the test beam by at least one optical short-pass filter 970.

FIGS. 11 (a) and (c) each show a spatial distribution of the measured fluorescence power in a plane which encompasses the longitudinal axis of the optical fiber 016 and which is perpendicular to a surface of the component carrier 015.

No correction of the power of the test beam in the vicinity of the fiber facet 021 was performed in FIG. 11 (a). As expected, in this case, the fluorescence power decreases on account of the interaction of the test beam with the non-planar initial structure 010 as said test beam increasingly approaches the fiber facet 021 and the surface of the component carrier 015, with the exception of an increase very near to the fiber facet 021, as predicted by the simulation in accordance with FIG. 6 (a). Accordingly, a lithographic patterning of the target structure 030 that is carried out without further correction measures also leads to an inadequate result wherein no crosslinking of the photoresist 110 is achieved in particular in the lower part of the target structure 030, as is evident for example from FIG. 11 (b).

On the basis of the spatial distribution of the measured fluorescence power, a correction of the optical power necessary for patterning can be achieved in a further step. For this purpose, it is possible to follow the strategy of firstly achieving a spatially constant fluorescence power by means of a correction factor for the power of the test beam, which correction factor is dependent on the position of the focal point. Assuming that the rate of the crosslinking reaction in the photoresist 110 and the emitted fluorescence power are dependent on the power of the lithography beam 060 or the test beam according to the same non-linear relationship, a spatially homogeneous crosslinking of the photoresist 110 can also be achieved using the same spatial correction specification for the lithography power. In the present exemplary embodiment, it is possible to achieve the location-dependent correction of the power on a simple multiplication by a correction factor $$D_{corr}(r) = (P_{Fl,0}/P_{Fl}(r))^{1/q} \quad (1)$$

wherein $P_{Fl}(r)$ represents the fluorescence power measured at the relevant location r, and $P_{Fl,0}$ represents the fluorescence power for a measurement far away from the fiber facet 021, in the case of which no disturbance of the test beam should be expected. q is an exponent describing the non-linear characteristic of the absorption process leading to the fluorescence emission and/or to the crosslinking. For the case of two-photon absorption considered here, q=2 holds true.

FIG. 11 (c) shows the result of the correction of the power of the test beam, which can lead to a spatially homogeneous distribution of the measured fluorescence power. By applying the same correction factor to the power of the lithography beam, it may also be possible to achieve, as expected, a uniform crosslinking of the test structure 030 over the entire height of the fiber facet, as is evident for example from FIG. 11 (d).

The correction specification according to equation (1) as used in the present example should be understood to be by way of example and can be correspondingly extended for other applications, preferably in view of the fact that a non-linear dependence of the luminescence emission on the power of the test beam need not necessarily have the same exponent as the non-linear dependence of the rate of the crosslinking reaction on the power of the lithography beam 060. In many cases, therefore, the power correction can also no longer be achieved by means of a simple multiplication by a correction factor, but rather can preferably be carried out on the basis of a more complex relationship, preferably a spatially and/or temporally non-local relationship. In the case of partial shading of the lithography beam 060 by a partly opaque initial structure 010, therefore, it may be advantageous, in particular, to carry out a plurality of measurements with different parameters in order to be able to separate effects with regard to intensity distributions in the vicinity of the focal point from the effects of the collecting efficiency of the luminescence detection unit 960.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

LIST OF REFERENCE SIGNS

010 Non-planar initial structure
011, 012 Partial regions of the initial structure that interact with the lithography beam
013 Changes in the initial structure in the partial regions that interact with the lithography beam
014 Partial region of the already produced target structure that interacts with the lithography beam
015 Component holder
016 Optical fiber
017 Integrated optical chip
018 Integrated optical waveguide
019 Waveguide core of a glass fiber
020 Topography of the non-planar initial structure
021 Light-emitting facet of an optical component
025 Partial regions of the initial structure that are highly reflective at the lithography wavelength
030, 031 Target structure 035 Partial regions of the already fabricated target structure which interact with the lithography beam during the exposure of subsequent partial regions
037 Inner partial region of the target structure
038 Near-surface partial region of the target structure
040 Volume element of the target structure
041 Midpoint of the volume element
050 Distance between the midpoint of the volume element and an edge that changes the lithography beam
052 Edge that changes the lithography beam
053 Partial region that is not correctly exposed on account of the change in the lithography beam by the edge
060 Lithography beam
065 Focal point (focus) of the lithography beam
070, 071 (Second) region of the lithography beam that is changed on account of the topography of the initial structure
080 (First) region of the lithography beam that is unchanged on account of the topography of the initial structure
090 Device for lithographically producing a target structure on a non-planar initial structure (lithography system)
100 Photoresist
110 Beam shaping unit
111, 112, 113 Partial regions of the beam shaping unit for changing regions of the lithography beam
160 Exposure optical unit
210 Measuring unit for detecting the topography of the initial structure
300 Photonic wire bond
310 Changes in the geometry of the photonic wire bond that arise as a result of the interaction of the lithography beam with the initial structure
400 Micro-optical lens element
500 Micro- or nanoscale structure
600 Lithography unit
620 Displacement table
700 Data processing unit
750 Data memory
770 Data describing the target structure
790 Data for correcting the changes in the lithography beam that are brought about as a result of the interaction with the initial structure
800 Further data processing unit
900 Optical measuring unit
940 Luminescence radiation
945 Test beam
950 Beam splitter
960 Luminescence detection unit
970 Short-pass filter
980 Photodetector

What is claimed is:

1. A device for lithographically producing a target structure on a non-planar initial structure by exposing a photoresist, the device comprising:
    a lithography unit for generating a lithography beam and for positioning the lithography beam within the photoresist;
    a beam shaping unit configured for influencing at least one of an amplitude or a phase distribution of the lithography beam; and
    a data processing unit configured for driving the lithography unit and the beam shaping unit, wherein the data processing unit is configured to store structure data of the target structure to be produced and data for correcting the change in the lithography beam that is caused by an interaction of the lithography beam with the non-planar initial structure and wherein no more than a portion of the target structure is formed by the non-planar initial structure.

2. The device of claim 1, further comprising at least one of:
    i) an optical measuring unit configured for detecting a topography of a surface of the non-planar initial structure; or
    ii) a luminescence detection unit configured for detecting luminescence radiation from the photoresist.

3. The device of claim 2, wherein the device includes a luminescence detection unit comprising a camera.

4. The device of claim 2 wherein the device includes a luminescence detection unit configured to determine the non-planar initial structure indirectly by detecting luminescence radiation from the focal region of the lithography beam when used with a photoresist which includes photoinitiators or a test medium which includes photoinitiators.

5. The device of claim 1, wherein the beam shaping unit comprises at least one of the following units:
    a spatial light modulator;
    a liquid crystal-based modulator;
    an acousto-optical modulator;
    an electro-optical modulator;
    a drivable diaphragm; or
    a micromirror array.

6. The device of claim 1, wherein the device is configured to generate a test beam having a center wavelength of 750 nm to 800 nm and wherein the data processing unit is configured to determine a correction parameter for the lithography beam based upon an interaction of the test beam with the initial structure.

7. The device of claim 1, wherein the device is configured to perform the following steps to lithographically produce the target structure on the non-planar initial structure by exposing the photoresist with the lithography beam:
    a) detecting a topography of a surface of the non-planar initial structure;
    b) using a test parameter for the lithography beam and determining an interaction of the lithography beam with the initial structure and the resultant change in at least one of the lithography beam or the target structure to be produced;
    c) determining a correction parameter for the lithography beam such that the change in the at least one of the lithography beam or the target structure to be produced that is caused by the interaction of the lithography beam with the initial structure is reduced; and
    d) producing the desired target structure on the initial structure by exposing the photoresist by means of the lithography beam using the correction parameter for the lithography beam.

8. The device of claim 7, wherein steps b) and c) are carried out iteratively whereby the change in the target structure to be produced due to the interaction of the lithography beam with the initial structure is increasingly reduced.

9. The device of claim 7, wherein the detecting of the topography of the surface of the non-planar initial structure is carried out using known data from a model of the non-planar initial structure or using a camera configured for determining the topography of the surface.

10. The device of claim 7, wherein the determining an interaction of the lithography beam with the initial structure and the resultant change in the lithography beam set with the test parameters during step b) is carried out by detecting luminescence radiation that is generated by the lithography beam set with the test parameters with a luminescence detection unit.

11. The device of claim 7, wherein the correction parameter for the lithography beam comprises an adaptation of at least one of an optical power, at least one wavelength, a write speed, a cross section, an amplitude profile, a phase profile, or a position of at least one region of the lithography beam.

12. The device of claim 7, wherein the correction parameter for the lithography beam comprises the adaptation of a beam shaping unit traversed by the lithography beam, whereby the adaptation of at least one of an amplitude or a phase distribution of the lithography beam is carried out.

13. The device of claim 7, wherein the correction parameter comprises first and second correction parameters that are changed in such a way that an individual adaptation to each volume element to be exposed is performed for the first correction parameter, while for the second correction parameter the same value is maintained for a multiplicity of volume elements within a selected group.

14. The device of claim 7, wherein the device is configured for use with a non-planar initial structure having an edge which interacts with the lithography beam and the influence of which is at least partly compensated for by the device by increasing the optical power of the lithography beam as the lithography beam approaches the edge.

15. The device of claim 7, wherein the device is configured for use with a photoresist which is a liquid that simultaneously serves as an immersion medium for a lithography lens and wherein the desired target structure produced on the initial structure by exposing the photoresist is at least partially formed by developed photoresist.

16. The device of claim 7, wherein the device is configured to determine the correction parameter in accordance with the following substeps:
   i) determining a first region of the lithography beam, in which the lithography beam reaches a midpoint of a volume element without interaction of the lithography beam with the non-planar initial structure;
   ii) determining a second region of the lithography beam, wherein the lithography beam interacts with the non-planar initial structure on a path to the midpoint of the volume element; and
   iii) modifying the first region or the second region of the lithography beam by a setting of at least one partial region of the beam shaping unit.

17. The device of claim 16, wherein substep iii) comprises blocking the second region of the lithography beam by a setting of a second partial region of the beam shaping unit and determining a setting for a first partial region of the beam shaping unit in such a way that a desired intensity distribution of the first region of the lithography beam occurs in a vicinity of the midpoint of the volume element.

18. The device of claim 7, wherein the device is configured to decompose the target structure into an inner partial region and a near-surface partial region, wherein determining the correction parameter for the lithography beam comprises determining mutually different correction parameters for the near-surface partial region and for the inner partial region.

19. The device of claim 7, wherein the device is configured to produce a target structure that includes at least one optical element, selected from the group comprising a refractive optical element, a diffractive optical element, an optical waveguide or a combination thereof.

20. The device of claim 7, wherein the device is configured for use with an initial structure which is partially non-transparent to the lithography beam and the interaction of the lithography beam with the initial structure includes interaction of the lithography beam with partial regions of the initial structure which are non-transparent to the lithography beam.

* * * * *